United States Patent
Lee et al.

(10) Patent No.: US 9,276,038 B2
(45) Date of Patent: Mar. 1, 2016

(54) LIGHT EMITTING MODULE

(71) Applicant: LG INNOTEK CO., LTD., Seoul (KR)

(72) Inventors: Gun Kyo Lee, Seoul (KR); In Yong Park, Seoul (KR); Jong Woo Lee, Seoul (KR); Ju Young Lee, Seoul (KR); Yun Min Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 51 days.

(21) Appl. No.: 14/205,833

(22) Filed: Mar. 12, 2014

(65) Prior Publication Data
US 2014/0264395 A1    Sep. 18, 2014

(30) Foreign Application Priority Data

Mar. 13, 2013    (KR) .................. 10-2013-0026538

(51) Int. Cl.
*H01L 33/00* (2010.01)
*H01L 27/15* (2006.01)
*F21S 8/10* (2006.01)
*H01L 33/20* (2010.01)
*F21Y 105/00* (2006.01)
*H01L 25/075* (2006.01)

(52) U.S. Cl.
CPC .......... *H01L 27/156* (2013.01); *F21S 48/1104* (2013.01); *F21S 48/1154* (2013.01); *F21S 48/1163* (2013.01); *F21S 48/1747* (2013.01); *H01L 27/15* (2013.01); *F21Y 2105/003* (2013.01); *H01L 25/0753* (2013.01); *H01L 33/20* (2013.01); *H01L 2924/0002* (2013.01)

(58) Field of Classification Search
CPC .............................. H01L 27/15; H01L 27/156
USPC ........................................................ 257/88
See application file for complete search history.

(56) References Cited

U.S. PATENT DOCUMENTS

| | | |
|---|---|---|
| 2012/0161184 A1 | 6/2012 | Ubahara et al. |
| 2012/0294024 A1 | 11/2012 | Peck et al. |

FOREIGN PATENT DOCUMENTS

| | | |
|---|---|---|
| CN | 1992359 A | 7/2007 |
| DE | 102006015117 A1 | 10/2007 |
| EP | 1768192 A2 | 3/2007 |
| EP | 2085688 A2 | 8/2009 |
| EP | 2821282 A2 | 1/2015 |
| JP | 2012-169189 A | 9/2012 |

*Primary Examiner* — David S Blum
(74) *Attorney, Agent, or Firm* — Birch, Stewart, Kolasch & Birch, LLP

(57) ABSTRACT

Disclosed is a light emitting module. The light emitting module includes a substrate and a plurality of light emitting devices disposed on the substrate, at least one of the plurality of light emitting devices includes a plurality of light emitting cells which are individually driven, and the plurality of light emitting cells include a light emitting structure including a first semiconductor layer, an active layer, and a second semiconductor layer, and has a light emitting surface emitting light.

20 Claims, 21 Drawing Sheets

LIGHT EMITTING MODULE

CROSS REFERENCE TO RELATED APPLICATION

This application claims priority under 35 U.S.C. §119 to Korean Patent Application No. 10-2013-0026538, filed in Korea on Mar. 13, 2013, which is hereby incorporated in its entirety by reference as if fully set forth herein.

TECHNICAL FIELD

Embodiments relate to a light emitting module and a lamp apparatus.

BACKGROUND

In general, a lamp refers to an apparatus which supplies or adjusts light for a specific purpose. As a light source of the lamp, an incandescent light, a fluorescent light, or a neon light may be used. Recently, a light emitting diode (LED) is used.

A lamp unit may generally include a light emitting module and a reflector setting an orientation angle of light emitted from the light emitting module. Here, the light emitting module may include at least one light emitting diode (LED) provided on a printed circuit board (PCB).

Such a lamp unit may be used in a backlight, a display device, a lighting lamp, an indicating lamp for vehicles, or a headlamp according to purposes thereof.

Particularly, a lamp unit used in vehicles closely relates to safe driving of a vehicle and thus, needs to be operated to be suit safe driving standards. For example, the lamp unit used in vehicles needs to satisfy regulations regarding a cut-off line so as not to obstruct a field of vision of a driver of a vehicle approaching on the opposite side of the road.

SUMMARY

Embodiments provide a light emitting module and a lamp apparatus which may reduce dark regions.

In one embodiment, a light emitting module includes a substrate and a plurality of light emitting devices disposed on the substrate, wherein at least one of the plurality of light emitting devices includes a plurality of light emitting cells which are individually driven, and the plurality of light emitting cells include a light emitting structure including a first semiconductor layer, an active layer, and a second semiconductor layer, and has a light emitting surface.

An angle between two neighboring sides of the light emitting surface of at least one of the plurality of light emitting cells may be 15°~45°.

At least one of the plurality of light emitting devices may include a light emitting cell having a triangular light emitting surface.

At least one of the plurality of light emitting devices may include a light emitting cell having a tetragonal light emitting surface.

At least one of the plurality of light emitting devices may include two light emitting cells, which have a right-angle triangular light emitting surface, oblique sides of the light emitting surfaces of the two light emitting cells may be opposite to each other, and an angle between the oblique side and a neighboring side may be 15°~45°.

At least one of the plurality of light emitting devices may include at least one first light emitting cell having a triangular light emitting surface and at least one second light emitting cell having a tetragonal light emitting surface.

Each of the plurality of light emitting devices may further include an insulating layer disposed between neighboring light emitting cells.

The light emitting module may further include at least one pad connected to at least one of the plurality of light emitting cells.

The light emitting module may further include at least one wire bonded to the at least one pad.

Power to drive at least one of the plurality of light emitting cells may be independently applied to the at least one pad through the at least one wire.

The light emitting surface may be the upper surface of the light emitting structure.

In another embodiment, a light emitting module includes a substrate and a plurality of light emitting devices disposed on the substrate in a matrix including C columns (C being a natural number >1) and R rows (R being a natural number >1), wherein the plurality of light emitting devices includes light emitting cells which are individually driven, the light emitting cells includes a light emitting structure including a first semiconductor layer, an active layer, and a second semiconductor layer, and has a light emitting surface, at least one of the plurality of light emitting devices included in at least one column is a first light emitting device, and the first light emitting device includes a light emitting cell having a triangular light emitting surface.

The first light emitting device may include two light emitting cells, and light emitting surfaces of the two light emitting cells may have a triangular shape.

The light emitting surfaces of the two light emitting cells may have a right-angle triangular shape, and oblique sides of the light emitting surfaces of the two light emitting cells may be opposite to each other.

The first light emitting device may include a first light emitting cell having a tetragonal first light emitting surface, a second light emitting cell having a tetragonal second light emitting surface, a third light emitting cell having a triangular third light emitting surface, and a fourth light emitting cell having a triangular fourth light emitting surface.

The first light emitting surface and the second light emitting surface may have a square shape including first to fourth sides, the third light emitting surface and the fourth light emitting surface may have a right-angle triangular shape including first to third sides, the first side of the first light emitting surface and the first side of the second light emitting surface may neighbor each other and be opposite to each other, and the first side of the third light emitting surface and the first side of the fourth light emitting surface may be oblique sides opposite to each other.

An angle between the first side and the second side of the third light emitting surface and the fourth light emitting surface may be 15°~45°.

The reminding light emitting devices except for the first light emitting device among the plurality of light emitting devices may be second light emitting devices, the second light emitting devices may include four light emitting cells, and the light emitting surface of the four light emitting cells may have a tetragonal shape.

In yet another embodiment, a light emitting module includes a substrate and a plurality of light emitting devices disposed on the substrate and individually driven, wherein the plurality of light emitting devices includes a light emitting structure including a first semiconductor layer, an active layer, and a second semiconductor layer, and has a light emitting surface, and the light emitting surface has a parallelogram shape.

An angle between two neighboring sides of the light emitting surface may be equal to or greater than 15° and less than 90°.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
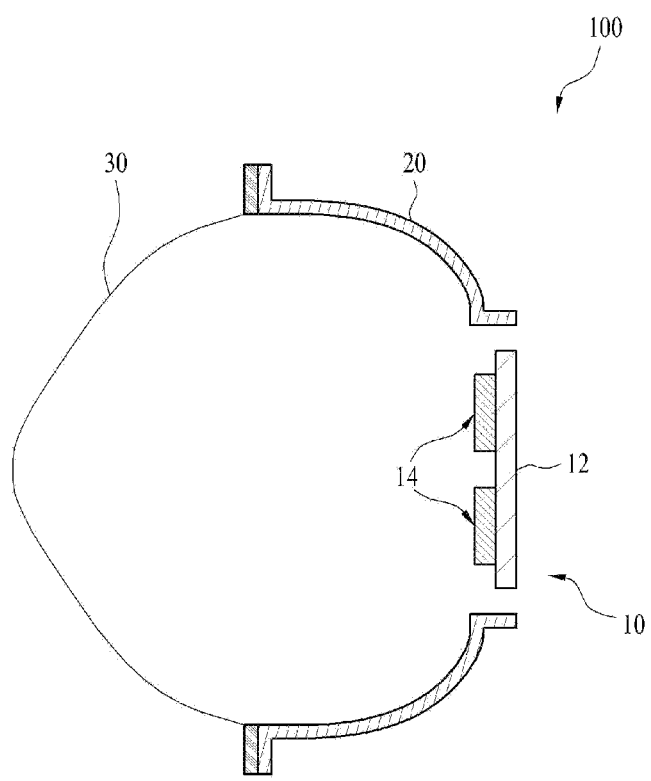
FIG. 1 is a view illustrating a lamp apparatus in accordance with one embodiment.

Hereinafter, embodiments will be described with reference to the annexed drawings. It will be understood that when a layer (film), a region, a pattern, or a structure is referred to as being "on" or "under" a substrate, another layer (film), another region, a pad, or a pattern, it can be directly on/under the substrate, the layer (film), the region, the pad, or the pattern, and one or more intervening layers may also be present. Expression of "on" and "under", may include the meaning of the downward direction as well as the upward direction based on one element.

In the drawings, sizes may be exaggerated, omitted, or schematically illustrated for convenience and clarity of description. Further, the sizes of the respective elements do not represent actual sizes thereof. Wherever possible, the same reference numbers will be used throughout the drawings to refer to the same or like parts. Hereinafter, a light emitting module and a lamp apparatus having the same in accordance with one embodiment will be described with reference to the accompanying drawings.

Figure 2:
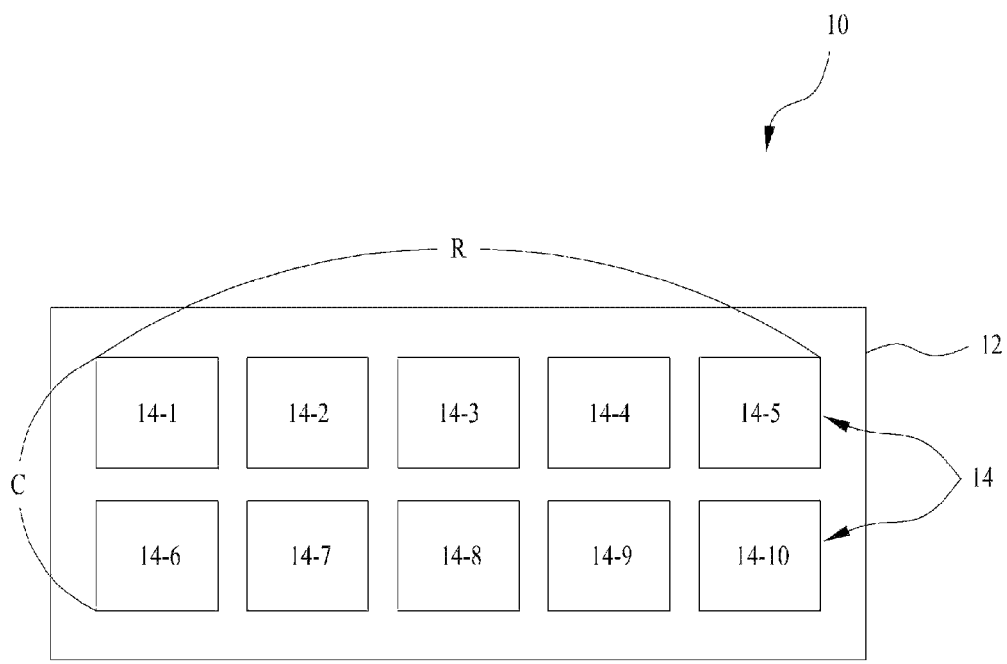
FIG. 2 is a view illustrating a light emitting module shown in FIG. 1.

FIG. 1 is a view illustrating a lamp apparatus 100 in accordance with one embodiment and FIG. 2 is a view illustrating a light emitting module 10 shown in FIG. 1.

With reference to FIGS. 1 and 2, a lamp apparatus 100 includes a light emitting module 10, a reflector 20, and a lens 30.

The light emitting module 10 generates light, and may include a substrate 12 and a light source 14 disposed on the substrate 12.

The reflector 20 is disposed around the light emitting module 10 and reflects light emitted from the light emitting module 10 in a designated direction, for example, in the forward direction of the light emitting module 10.

The lens 30 may refract and transmit light emitted from the light emitting module 10 or reflected by the reflector 20. Light having passed through the lens 30 may proceed in a designated direction.

The light source 14 may include a plurality of light emitting devices 14-1 to 14-n (n being a natural number >1), and the plurality of light emitting devices 14-1 to 14-n (n being a natural number >1) may be separated from each other on the substrate 12. For example, the plurality of light emitting devices 14-1 to 14-n (n being a natural number >1) may be light emitting diodes (LEDs).

The plurality of light emitting devices 14-1 to 14-n (n being a natural number >1) may be arranged in a row, or be arranged in a matrix including C columns and R rows.

For example, the plurality of light emitting devices 14-1 to 14-n (n being a natural number >1) may be arranged in a matrix including 2 columns and 2 rows. First light emitting devices, for example, light emitting devices 14-1 to 14-5, may be arranged in a line in the first column, and second light emitting devices, for example, light emitting devices 14-6 to 14-10, may be arranged in a line in the second column.

Figure 3:
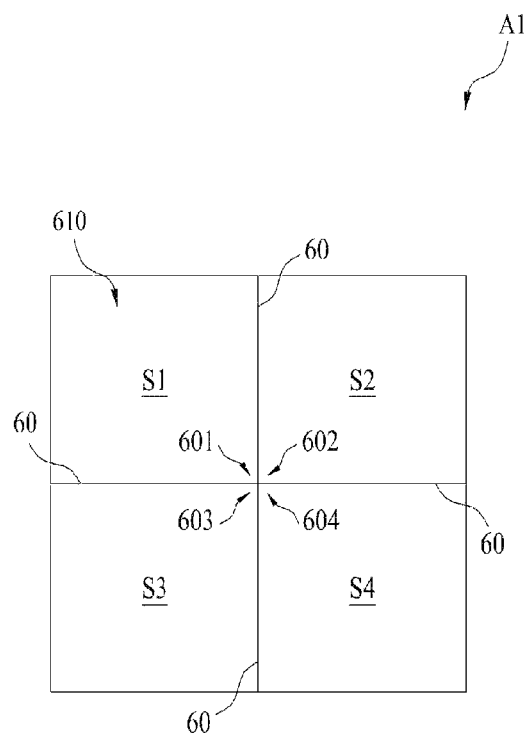
FIG. 3 is a view illustrating a light emitting device in accordance with one embodiment.

FIG. 3 is a view illustrating a light emitting device A1 in accordance with one embodiment.

At least one of the plurality of light emitting devices 14-1 to 14-*n* (n being a natural number >1) may be the light emitting device A1 shown in FIG. 3.

With reference to FIG. 3, the light emitting device A1 may include a plurality of light emitting cells S1 to Sk (k being a natural number >1). For example, the light emitting device A1 may be implemented as a single chip, and the single chip may include the plurality of light emitting cells S1 to SR (k being a natural number >1).

The plurality of light emitting cells S1 to Sk (k being a natural number >1) may be individually driven to emit light. For example, the light emitting device A1 may include four light emitting cells S1 to S4 individually driven to emit light but is not limited thereto.

FIGS. 4A to 4D are views illustrating examples of light emission of the light emitting cells S1 to Sk (for example, k=4) shown in FIG. 3.

Figure 4A:
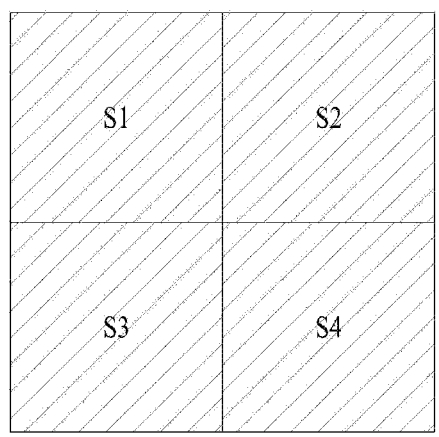
FIGS. 4A to 4D are views illustrating examples of light emission of light emitting cells shown in FIG. 3.

FIG. 4A illustrates one example of light emission in which all of the plurality of light emitting cells S1 to Sk (for example, k=4) emit light.

Figure 4B:
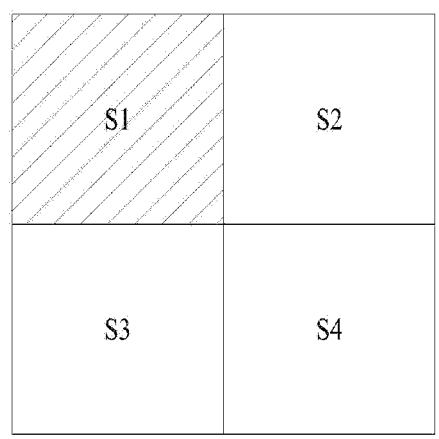

FIG. 4B illustrates another example of light emission in which only one, for example, the light emitting cell S1, of the plurality of light emitting cells S1 to Sk (for example, k=4) emits light. As other examples, one of the light emitting cells S2, S3, and S4 may emit light.

Figure 4C:
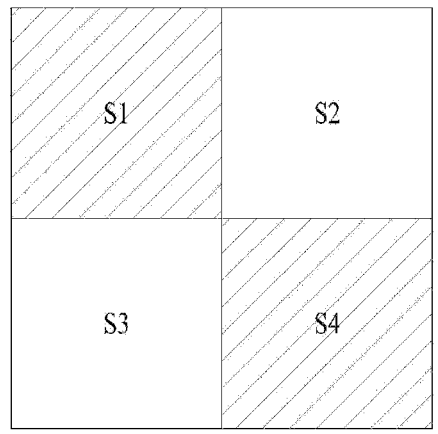

FIG. 4C illustrates one example of light emission in which two light emitting cells, for example, the light emitting cells S1 and S4, selected from the plurality of light emitting cells S1 to Sk (for example, k=4) emit light.

Figure 4D:
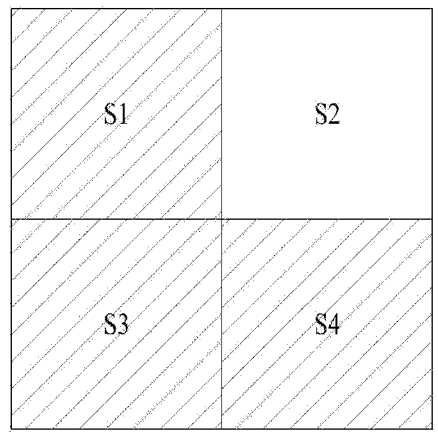

FIG. 4D illustrates one example of light emission in which three light emitting cells, for example, the light emitting cells S1, S3, S4, selected from the plurality of light emitting cells S1 to Sk (for example, k=4) emit light. Although there are other examples than the above-described examples, a detailed description thereof will be omitted because these examples may be sufficiently expected.

Figure 5:
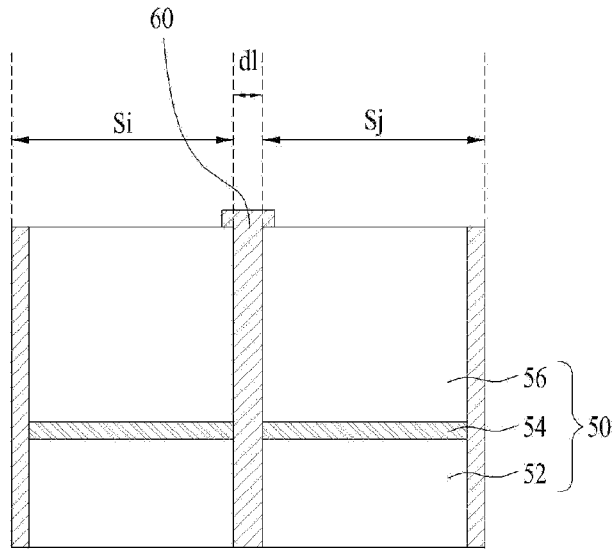
FIG. 5 is a cross-sectional view illustrating neighboring light emitting cells shown in FIG. 3.

FIG. 5 is a cross-sectional view illustrating neighboring light emitting cells shown in FIG. 3.

With reference to FIG. 5, each of the light emitting devices 14-1 to 14-n (n being a natural number >1) may includes a plurality of light emitting cells S1 to Sk (k being a natural number >1) emitting light and separated from each other, and an insulating layer 60 located between neighboring light emitting cells.

The insulating layer 60 may be formed of a light transmissive material or a light non-transmissive material. For example, the insulating layer 60 may be formed of at least one of $SiO_y$ (y being a positive real number), AlN, TiN, $Si_3N_4$, $Al_2O_3$, and $TiO_x$ (x being a positive real number). A separation distance d1 between neighboring light emitting cells Si and Sj (i and j being natural numbers ≥1) may be 10 μm~20 μm.

The light emitting cells S1 to Sk (k being a natural number >1) may be electrically isolated from each other by spaces between the light emitting cells S1 to Sk (k being a natural number >1) or the insulating layer 60.

For example, the insulating layer 60 may be interposed between the neighboring light emitting cells Si and Sj (i and j being natural numbers ≥1) and be located on the side surfaces of the light emitting cells S1 to Sk (k being a natural number >1).

As exemplarily shown in FIG. 3, the insulating layer 60 interposed between the light emitting cells S1 to Sk (for example, k=4) may have a shape which is the same as or similar to the shape of spaces between the light emitting cells S1 to Sk (for example, k=4), for example, a cross shape.

Each of the light emitting cells S1 to Sk (k being a natural number >1) may include a light emitting structure 50 including a first semiconductor layer 52, an active layer 54, and a second semiconductor layer 56, which are sequentially stacked.

The first semiconductor layer 52 may be formed of a group III-V or II-VI compound semiconductor and be doped with a first conductivity-type dopant.

For example, the first semiconductor layer 52 may be formed of a semiconductor having a compositional formula of $In_xAl_yGa_{(1-x-y)}N$ (0≤x≤1, 0≤y≤1, 0≤x+y≤1) and be doped with an n-type dopant (for example: Si, Ge, Sn, etc.).

The active layer 54 may generate light by energy generated by a recombination process of electrons and holes provided from the first semiconductor layer 52 and the second semiconductor layer 56.

The active layer 54 may be disposed between the first semiconductor layer 52 and the second semiconductor layer 56 and formed of a compound semiconductor, for example, a group III-V or II-VI compound semiconductor.

The active layer 54 may be formed in a structure, such as a single quantum well structure, a multi-quantum well structure, a quantum wire structure, or a quantum dot structure.

If the active layer 54 is formed in a quantum well structure, the active layer 54 may be formed in a single or multi-quantum well structure including a well layer having a compositional formula of $In_xAl_yGa_{(1-x-y)}N$ (0≤x≤1, 0≤y≤1, 0≤x+y≤1) and a barrier layer having a compositional formula of $In_aAl_bGa_{(1-a-b)}N$ (0≤a≤1, 0≤b≤1, 0≤a+b≤1). The well layer may be formed of a material having a bandgap lower than the bandgap of the barrier layer.

The second semiconductor layer 56 may be formed of a group III-V or II-VI compound semiconductor and be doped with a second conductivity-type dopant.

For example, the second semiconductor layer 56 may be a semiconductor having a compositional formula of $In_xAl_yGa_{(1-x-y)}N$ (0≤x≤1, 0≤y≤1, 0≤x+y≤1) and be doped with a p-type dopant (for example: Mg, Zn, Ca, Sr, Ba, etc.).

The shape of each of the light emitting cells S1 to Sk (for example, k=4) in accordance with this embodiment may be a tetragon (for example, a square), the four light emitting cells S1 to Sk (for example, k=4) may be disposed so as to neighbor each other, and the insulating layer 60 may be located between neighboring light emitting cells.

The light emitting cells S1 to Sk (for example, k=4) may respectively have first corners 601, 602, 603, and 604 located adjacent to each other, and each of two side surfaces of the light emitting cells S1 to Sk (for example, k=4) connected to the first corners 601, 602, 603, and 604 may be opposite to one side surface of each of other light emitting cells.

For example, one of two side surfaces of the first light emitting cell S1 connected to the first corner 601 may be opposite to one side surface of the second light emitting cell S2, and the other of the two side surfaces may be opposite to one side surface of the third light emitting cell S3.

For example, each of the light emitting cells S1 to Sk (for example, k=4) may have a tetragonal (for example, a square) light emitting surface 610. The light emitting surface 610 may be one surface (for example, the upper surface) of the light emitting cell emitting light, or the upper surface of the light emitting structure included in the light emitting cell, and the light emitting surface 610 may include four sides.

One of neighboring sides belonging to the light emitting surface 610 of one light emitting cell may be opposite to one side belonging to the light emitting surface 610 of another light emitting cell, and the other of the neighboring sides may be opposite to one surface belonging to the light emitting surface 610 of a further light emitting cell.

Figure 6:
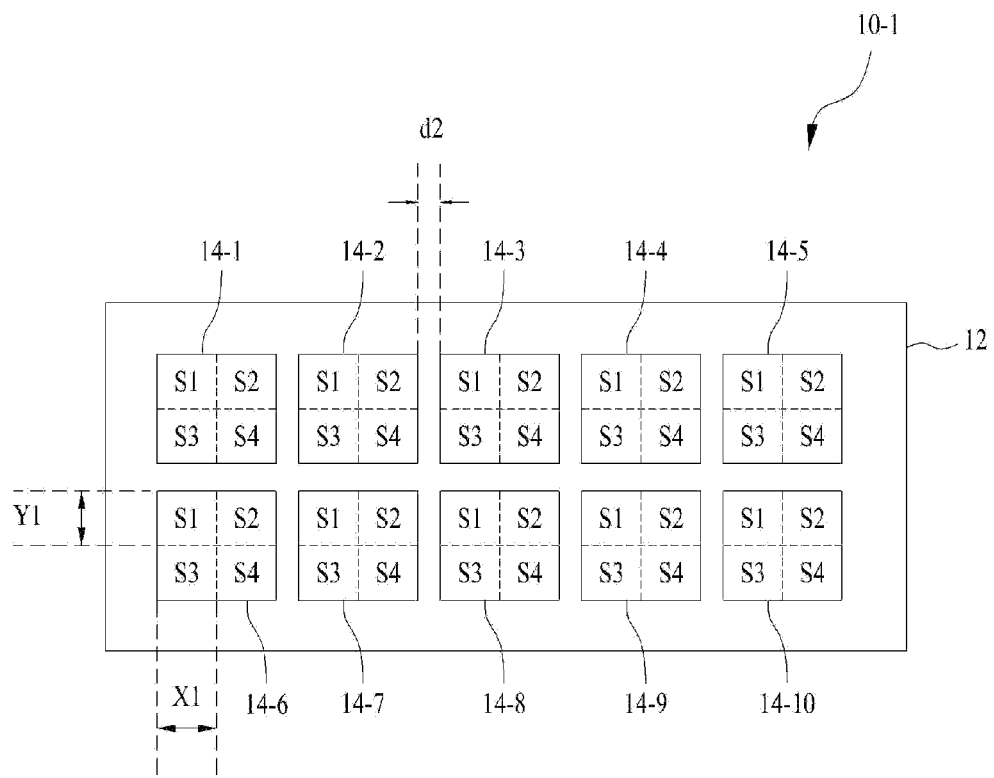
FIG. 6 is a view illustrating a light emitting module in accordance with one embodiment.

FIG. 6 is a view illustrating a light emitting module 10-1 in accordance with one embodiment.

With reference to FIG. 6, the light emitting module 10-1 may include a substrate 12 and a plurality of light emitting devices 14-1 to 14-n (n being a natural number >1) disposed on the substrate 12.

The substrate 12 may include a first substrate 12-1 and a second substrate 12-2, and each of the light emitting devices 14-1 to 14-n (n being a natural number >1) may be the light emitting device A1 in accordance with the embodiment shown in FIG. 3.

A separation distance d1 between neighboring light emitting cells Si and Sj (i and j being natural numbers 1) may less than a separation distance d2 between neighboring light emitting devices. For example, the separation distance d2 between neighboring light emitting devices may be 50 μm~100 μm.

Figure 7:
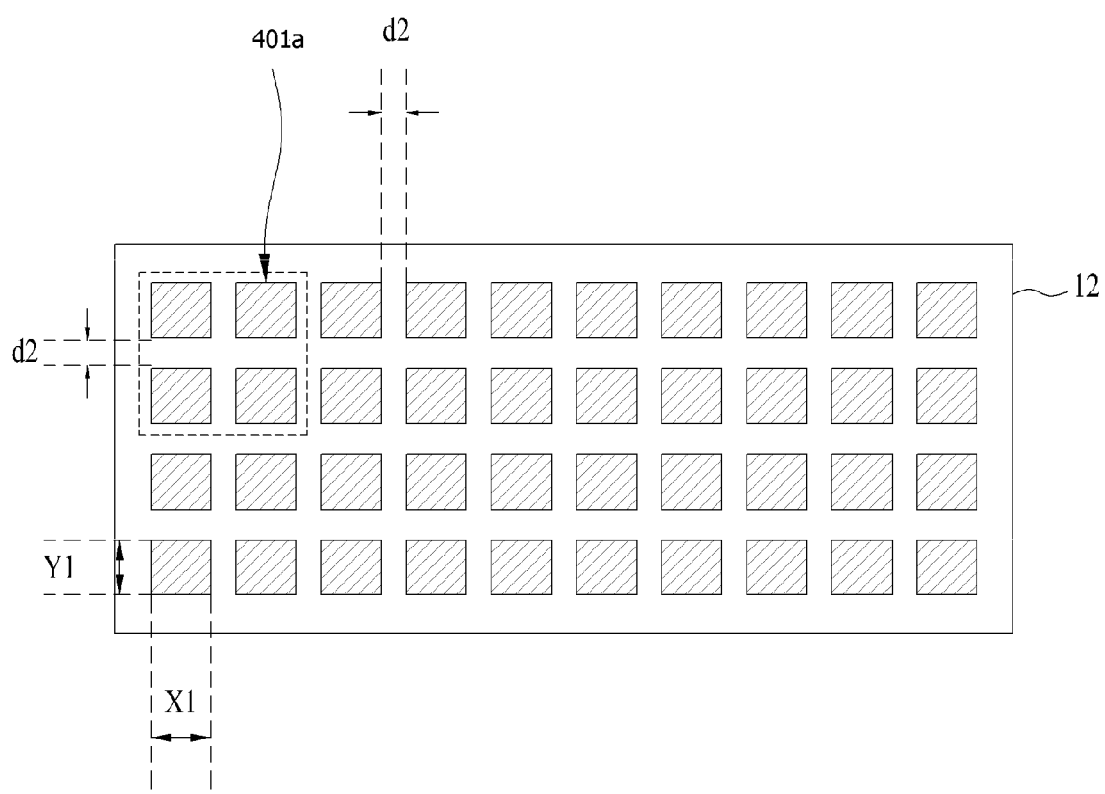
FIG. 7 is a view illustrating a light emitting module implemented by light emitting chips having the same area as light emitting cells shown in FIG. 6.

FIG. 7 is a view illustrating a light emitting module implemented by light emitting chips 401a having the same area as the light emitting cells shown in FIG. 6.

With reference to FIGS. 6 and 7, the number of the light emitting chips 401a may be equal to the total number of the light emitting cells A1 to Sk (k being a natural number >1) included in the light emitting module 10-1.

Since the area (X1×Y1) of one light emitting chip 401a is equal to the area (X1×Y1) of one light emitting cell shown in FIG. 6 and the total number of the light emitting chips 401a is equal to the total number of the light emitting cells A1 to Sk (k being a natural number >1), the light emitting module shown in FIG. 7 may have a light emitting area which is equal to or slightly less than the light emitting area of the light emitting module 10-1 shown in FIG. 6.

In general, an area located between neighboring light emitting devices of a light emitting module and an area between neighboring light emitting cells may be non-emissive areas and form dark regions during light distribution. The size of the dark regions may be proportional to the size of the non-emissive areas.

Since the separation distance d1 between the light emitting cells shown in FIG. 6 is less than the separation distance d2 between the light emitting chips shown in FIG. 7, the light emitting module 10-1 in accordance with this embodiment may reduce dark regions, as compared to the light emitting module shown in FIG. 7.

Figure 8:
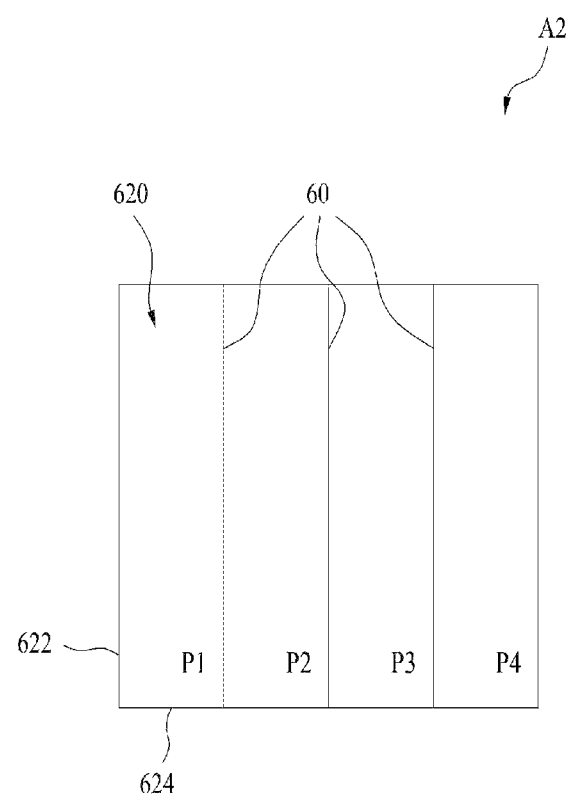
FIG. 8 is a view illustrating a light emitting device in accordance with another embodiment.

FIG. 8 is a view illustrating a light emitting device A2 in accordance with another embodiment.

At least one of the plurality of light emitting devices 14-1 to 14-n (n being a natural number >1) may be the light emitting device A2 shown in FIG. 8.

With reference to FIG. 8, the light emitting device A2 may include a plurality of light emitting cells P1 to Pk (k being a natural number >1) individually driven to emit light. For example, the light emitting device A2 may include four light emitting cells P1 to P4, but is not limited thereto.

For example, the shape of each of the light emitting cells P1 to Pk (for example, k=4) in accordance with this embodiment may be a rectangle, the four light emitting cells P1 to Pk (for example, k=4) may be disposed so as to neighbor each other, and the insulating layer 60 may be located between neighboring light emitting cells.

The long sides of the light emitting cells P1 to Pk (for example, k=4) may be opposite to each other, and the short sides of the light emitting cells P1 to Pk (for example, k=4) may be parallel to each other. For example, one long side of one P1 of two neighboring light emitting cells, for example, the light emitting cells P1 and P2, may be opposite to one long side of the other P2.

For example, each of the light emitting cells P1 to Pk (for example, k=4) may have a rectangular light emitting surface 620. The light emitting surface 620 may be one surface (for example, the upper surface) of the light emitting cell emitting light, and the light emitting surface 620 may include two long sides, for example, sides 622 and two short sides, for example, 624). One long side of one of two neighboring light emitting surfaces 620 may be opposite to one long side of the other.

Figure 9:
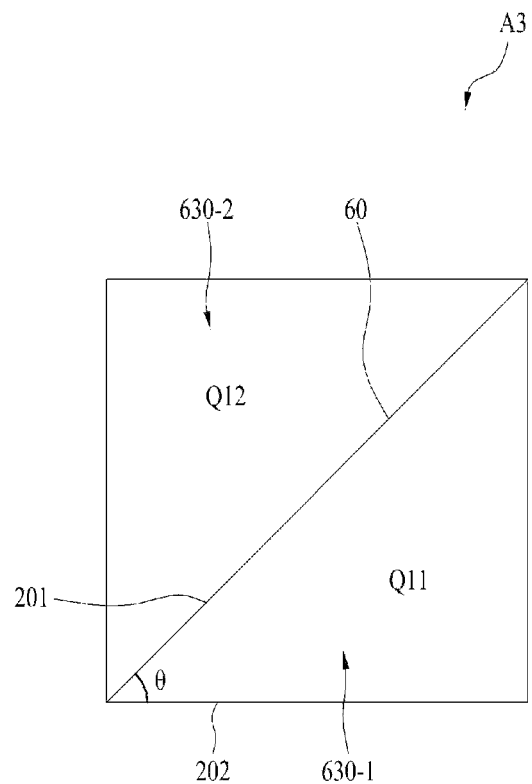
FIG. 9 is a view illustrating a light emitting device in accordance with another embodiment.

FIG. 9 is a view illustrating a light emitting device A3 in accordance with another embodiment.

With reference to FIG. 9, at least one of the plurality of light emitting devices 14-1 to 14-n (n being a natural number >1) may be the light emitting device A3 shown in FIG. 9.

The light emitting device A3 may include a plurality of light emitting cells Q11 to Q1m (m being a natural number >1) individually driven to emit light. For example, the light emitting device A3 may include two light emitting cells Q11 and Q12 which are individually driven, and the insulating layer 60 may be located between neighboring light emitting cells.

The shape of each of the light emitting cells Q11 and Q12 in accordance with this embodiment may be a triangle, the two light emitting cells Q11 and Q12 may be disposed so as to neighbor each other, and the insulating layer 60 may be located between the light emitting cells Q11 and Q12 and thus electrically isolate the light emitting cells Q11 and Q12.

The light emitting cells Q11 and Q12 may have triangular light emitting surfaces 630-1 and 630-2. Each of the light emitting surfaces 630-1 and 630-2 may be one surface (for example, the upper surface) of the light emitting cell emitting light and include three sides.

At least one, for example, the light emitting cell Q11, of the light emitting cells Q11 and Q12 may have a light emitting surface, for example, 630-1, in which an angle θ between two neighboring sides, for example, 201 and 202, is 15°~45°.

For example, each of the two light emitting cells Q11 and Q12 may have a right-angle triangular light emitting surface, and oblique sides of the light emitting surfaces of the two light emitting cells Q11 and Q12 may neighbor each other and be opposite to each other. Further, an angle δ between a first side 201 and a second side 202 of the light emitting surface 630-1 of the first light emitting cell Q11 may be 15°~45°. Further, an angle between neighboring side surfaces of a light emitting structure 50 of the first light emitting cell Q11 may be 15°~45°.

Figure 10:
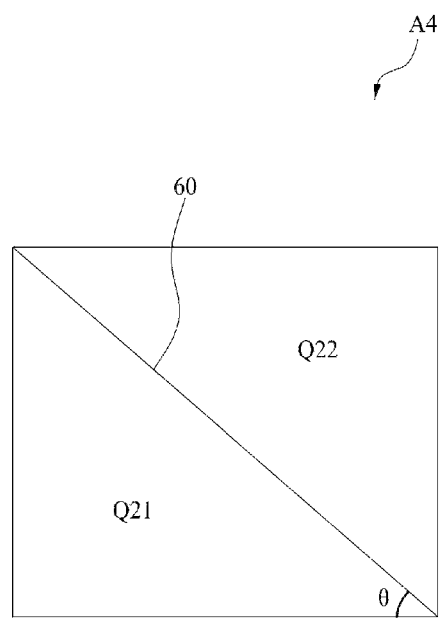
FIG. 10 is a view illustrating a light emitting device in accordance with another embodiment.

FIG. 10 is a view illustrating a light emitting device A4 in accordance with another embodiment.

With reference to FIG. 10, at least one of the plurality of light emitting devices 14-1 to 14-n (n being a natural number >1) may be the light emitting device A4 shown in FIG. 10.

The light emitting device A4 in accordance with this embodiment is a modification of the light emitting device A3 in accordance with the embodiment shown in FIG. 9 and differs from the light emitting device A3 in terms of the arrangement of light emitting cells Q21 and Q22. That is, the light emitting device A4 may have a structure which is bilaterally symmetrical to the light emitting device A3.

Figure 11A:
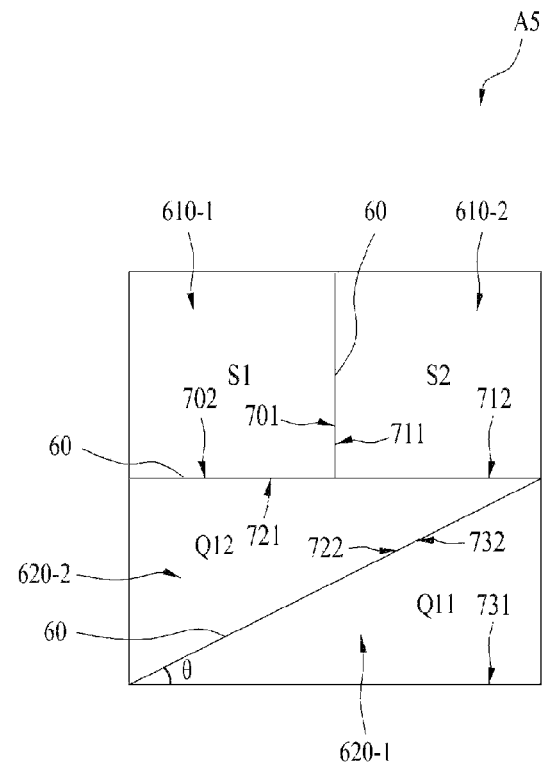
FIG. 11A is a view illustrating a light emitting device in accordance with another embodiment.

FIG. 11A is a view illustrating a light emitting device A5 in accordance with another embodiment.

With reference to FIG. 11A, at least one of the plurality of light emitting devices 14-1 to 14-n (n being a natural number >1) may be the light emitting device A5 shown in FIG. 11A.

The light emitting device A5 may include a plurality of light emitting cells A1 to Sk (k being a natural number >1) and Q11 to Q1m (m being a natural number >1) individually driven to emit light.

The light emitting device A5 may include tetragonal light emitting cells A1 to Sk (k being a natural number >1) and triangular light emitting cells Q11 to Q1m (m being a natural number >1), and the insulating layer 60 may be located between neighboring light emitting cells.

For example, the light emitting device A5 may include a first light emitting cell, for example, S1, having a tetragonal (for example, rectangular or square) first light emitting surface 610-1, a second light emitting cell, for example, S2, having a tetragonal (for example, rectangular or square) second light emitting surface 610-2, a third light emitting cell, for example, Q11, having a triangular (for example, right-angle triangular) third light emitting surface 620-1, and a fourth light emitting cell, for example, Q12, having a triangular (for example, right-angle triangular) fourth light emitting surface 620-2.

Each of the first light emitting surface 610-1 and the second light emitting surface 610-2 may include four sides, and each of the third light emitting surface 620-1 and the fourth light emitting surface 620-2 may include three sides.

The first side 701 of the first light emitting surface 610-1 and the first side 711 of the second light emitting surface 610-2 may neighbor each other and be opposite to each other.

The first side (oblique side) 732 of the third light emitting surface 620-1 and the first side (oblique side) 722 of the fourth light emitting surface 620-2 may be opposite to each other.

The second side 721 of the fourth light emitting surface 620-2 may correspond to and be opposite to the second side 702 of the first light emitting surface 610-1 and the second side 712 of the second light emitting surface 610-2.

The second side 721 of the fourth light emitting surface 620-2 may correspond to and be opposite to the second side 731 of the third light emitting surface 620-1.

An angle θ between the first side (oblique side) 732 and the second side 731 of the third light emitting surface 620-1 may be 15°~45°. Further, an angle θ between the first side (oblique side) 722 and the second side 721 of the fourth light emitting surface 620-2 may be 15°~45°.

An angle between neighboring side surfaces of the light emitting structure 50 of the third light emitting cell Q11 may be 15°~45°. Further, an angle between neighboring side surfaces of the light emitting structure 50 of the fourth light emitting cell Q12 may be 15°~45°.

Figure 11B:
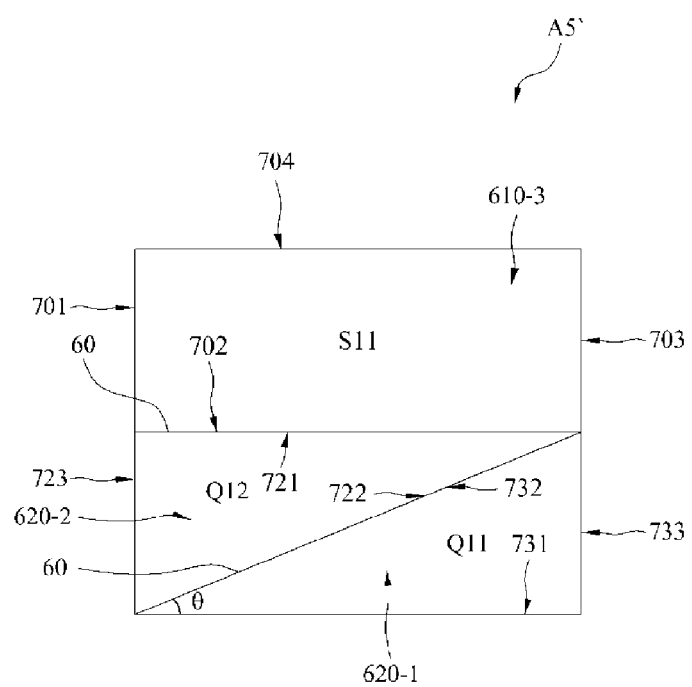
FIG. 11B is a view illustrating a light emitting device in accordance with a modification of the embodiment shown in FIG. 11A.

FIG. 11B is a view illustrating a light emitting device A5' in accordance with a modification of the embodiment shown in FIG. 11A.

With reference to FIG. 11B, at least one of the plurality of light emitting devices 14-1 to 14-n (n being a natural number >1) may be the light emitting device A5' shown in FIG. 11B.

The light emitting device A5' may include a first light emitting cell S11 and second light emitting cells Q11 and Q12 individually driven to emit light. A light emitting surface 610-3 of the first light emitting cell S11 may have a rectangular shape, and light emitting surfaces 620-1 and 620-2 of the second light emitting cells Q11 and Q12 may have a right-angle triangular shape. The insulating layer 60 may be located between neighboring light emitting cells.

The light emitting surface 610-3 may include four sides 701 to 704, and the light emitting surfaces 620-1 and 620-2 may include three sides 721 to 723 and 731 to 733.

The first side (oblique side) 732 of the light emitting surface 620-1 may neighbor and be opposite to the first side (oblique side) 722 of the light emitting surface 620-2.

The second side 721 of the light emitting surface 620-1 may neighbor and be opposite to the second side 702 of the light emitting surface 610-1.

The second side 721 of the light emitting surface 620-1 may correspond to and be opposite to the second side 731 of the light emitting surface 620-1.

An angle θ between the first side (oblique side) 732 and the second side 731 of the light emitting surface 620-1 may be 15°~45°. Further, an angle θ between the first side (oblique side) 722 and the second side 721 of the light emitting surface 620-2 may be 15°~45°.

Figure 12:
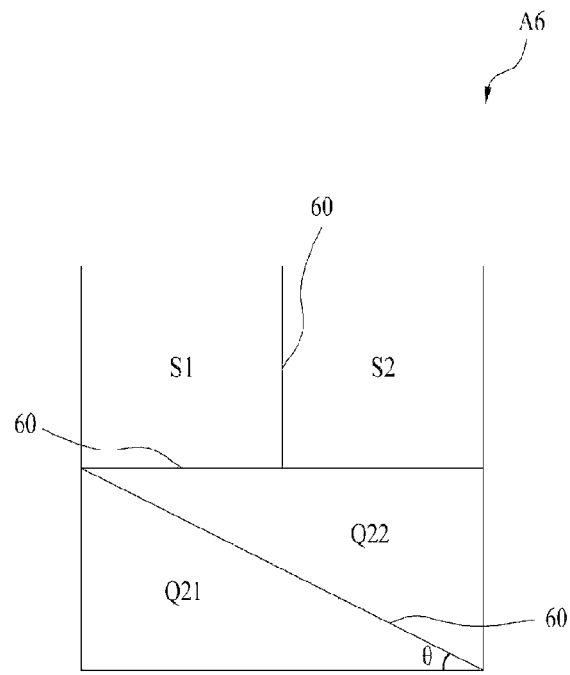
FIG. 12 is a view illustrating a light emitting device in accordance with another embodiment.

FIG. 12 is a view illustrating a light emitting device A6 in accordance with another embodiment.

With reference to FIG. 12, at least one of the plurality of light emitting devices 14-1 to 14-n (n being a natural number >1) may be the light emitting device A6 shown in FIG. 12.

The light emitting device A6 may include tetragonal (for example, square) first light emitting cells A1 to Sk (for example, k=2) and triangular (for example, right-angle triangular) second light emitting cells Q21 to Q2m (for example, m=2), and the insulating layer 60 may be located between neighboring light emitting cells.

The light emitting device A6 in accordance with this embodiment is equal to the light emitting device A5 in terms of the shape of the first light emitting cells, but the second light emitting cells Q21 and Q22 of the light emitting device A6 may have a structure which is bilaterally symmetrical to the second light emitting cells Q11 and Q12 of the light emitting device A5.

Figure 13:
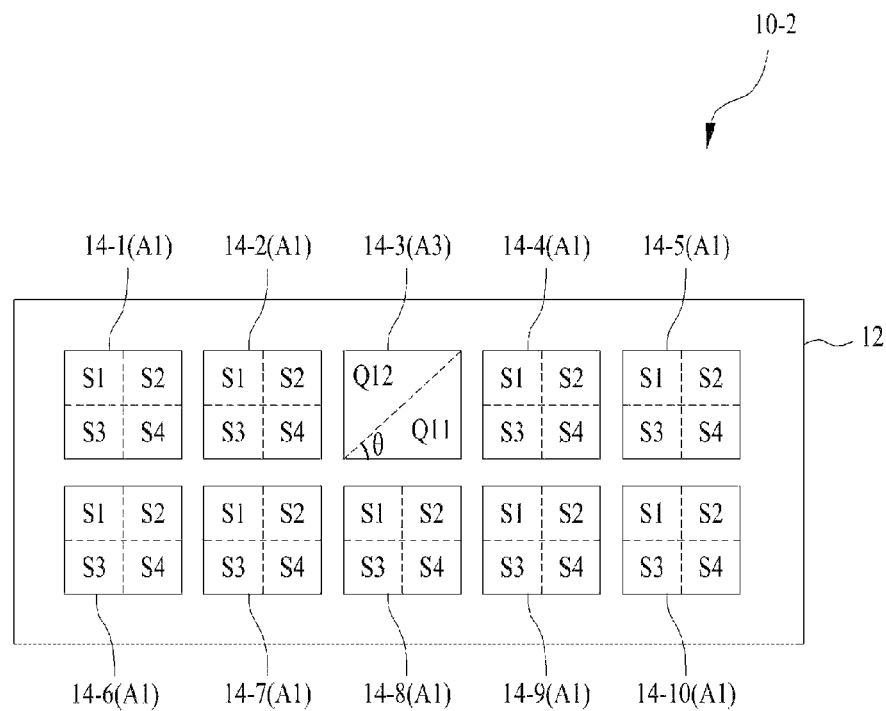
FIG. 13 is a view illustrating a light emitting module in accordance with another embodiment.

FIG. 13 is a view illustrating a light emitting module 10-2 in accordance with another embodiment.

With reference to FIG. 13, the light emitting module 10-2 may include a substrate 12 and a plurality of light emitting devices 14-1 to 14-n (n being a natural number >1) disposed on the substrate 12.

The plurality of light emitting devices 14-1 to 14-n (n being a natural number >1) may be arranged in a row, or be arranged in a matrix including C columns (C being a natural number >1) and R rows (R being a natural number >1).

For example, the plurality of light emitting devices 14-1 to 14-n may be arranged in a matrix including C columns (for example, C=2) and R rows (for example, R=5). In the first column, first light emitting devices, for example, 14-1 to 14-5, may be arranged in 5 rows and, in the second column, second light emitting devices, for example, 14-6 to 14-10, may be arranged in 5 rows.

At least one of the plurality of light emitting devices, for example, 14-1 to 14-10, included in the light emitting module 10-2 may be the light emitting device A3, and the remaining light emitting devices may be the light emitting devices A1.

At least one of the light emitting devices included in at least one column may be the light emitting device A4 in accordance with the embodiment shown in FIG. 9, and the remaining light emitting devices may be light emitting devices A1 in accordance with the embodiment shown in FIG. 3.

For example, one 14-3 of the light emitting devices 14-1 to 14-5 included in the $y^{th}$ column (y being a natural number satisfying C≥y≥1, for example, y=1) may be the light emitting device A3, and the remaining light emitting devices 14-1, 14-2, 14-4, and 14-5 may be the light emitting devices A1. For example, the light emitting device A3 may be located at the $x^{th}$ row (x being a natural number satisfying R≥x≥1, for example, x=3) of the $y^{th}$ column (y being a natural number satisfying C≥y≥1, for example, y=1), but is not limited thereto.

Figure 14:
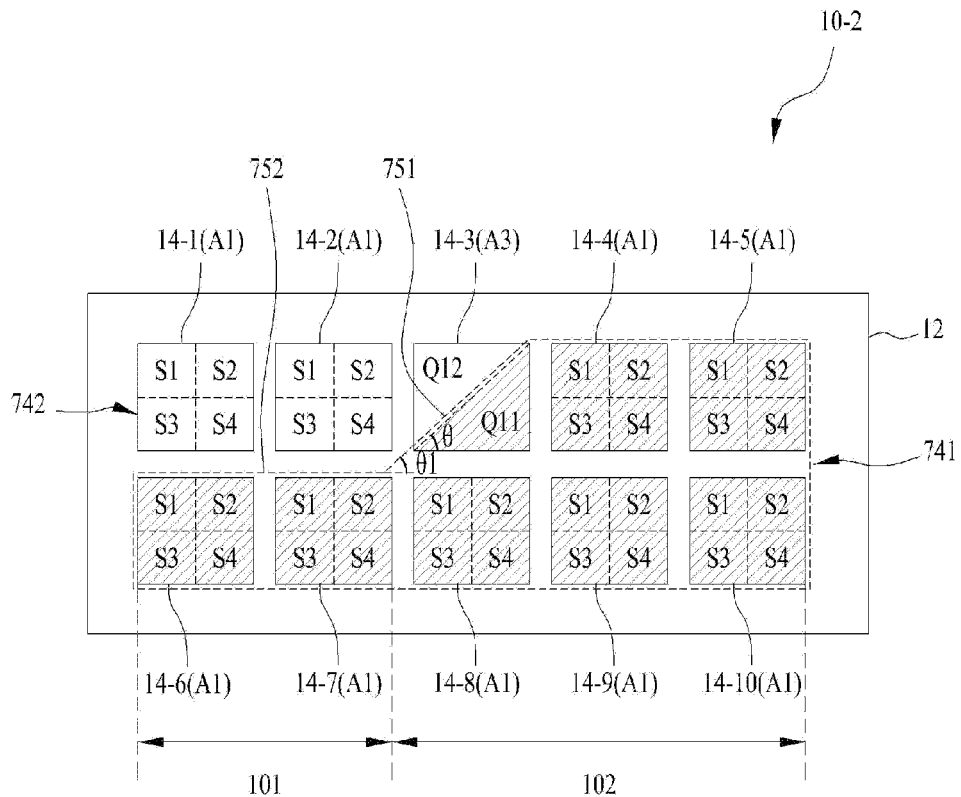
FIG. 14 is a view illustrating one example of light emission of the light emitting module in accordance with the embodiment.

FIG. 14 is a view illustrating one example of light emission of the light emitting module 10-2 in accordance with this embodiment.

With reference to FIG. 14, some, for example, Q11, of the light emitting cells, for example, Q11 and Q12, belonging to the light emitting device 14-3 provided as the light emitting device A3 may emit light, and the remaining light emitting cell, for example, Q12, may not emit light.

Some, for example, 14-4 to 14-10, of the light emitting devices 14-1, 14-2, and 14-4 to 14-10 provided as the light emitting devices A1 may emit light, and the remaining light emitting devices, for example, 14-1 and 14-2, may not emit light.

Among the light emitting cells belonging to the light emitting module 10-2, an area corresponding to the light emitting cells which emit light may be referred to as an emissive area 741, and an area corresponding to the light emitting cells which do not emit light may be referred to as a non-emissive area 742. In another embodiment, the non-emissive area 742 may include light emitting cells which do not emit light and the insulating layer 60.

The emissive area 741 may be discriminated from the non-emissive area 742 due to difference in light and darkness, and a first boundary line 751 may be formed between the non-emissive area 742 and the emissive area 741 corresponding to the light emitting device, for example, 14-3, provided as the light emitting device A3.

The first boundary line 751 may correspond to the edge of the emissive area 741 or a part of the sides of the emissive area 741 corresponding to the oblique side of the light emitting cell Q11 included in the light emitting device, for example, 14-3, provided as the light emitting device A3.

A second boundary line 752 may be formed between the non-emissive area 742 and the emissive area 741 corresponding to the light emitting devices, for example, 14-6 and 14-7, provided as the light emitting devices A1. The second boundary line 752 may correspond to the edge of the emissive area 741 or another part of the sides of the light emitting area 741 corresponding to one side of each of the light emitting cells A1 and S2 included in the light emitting devices, for example, 14-6 and 14-7, provided as the light emitting devices A1.

An angle of inclination θ1 of the first boundary line 751 to the second boundary line 752 may be equal to the angle θ between the two neighboring sides 731 and 732 of the light emitting surface 620-1 of the light emitting cell Q11 included in the light emitting device, for example, 14-3, provided as the light emitting device A3. For example, the angle of inclination θ1 of the first boundary line 751 to the second boundary line 752 may be 15°~45°.

The shape of the edges or the sides of the light emissive area 741 or the angle of inclination of the first boundary line 751 may be determined by light emission of the light emitting cells individually driven.

In general, a lamp unit used in vehicles needs to satisfy regulations regarding a cut-off line so as not to obstruct a field of vision of a driver of a vehicle approaching on the opposite side of the road. That is, the lamp unit used in vehicles should not apply light under the cut-off line so as not to obstruct a field of vision of a driver of a vehicle approaching on the opposite side of the road.

The light emitting module 10-2 in accordance with this embodiment may individually drive the light emitting cells included in the light emitting devices 14-1 to 14-10 so that the angle of inclination θ1 of the first boundary line 751 may be 15°~45°, thus being capable of satisfying regulations regarding a cut-off line.

That is, the light emitting module 10-2 in accordance with this embodiment may include at least one light emitting device A3 including the light emitting cells Q11 and Q12 having the light emitting surfaces, for example, 620-1 and 620-2, satisfying regulations regarding a cut-off line and satisfy regulations regarding a cut-off line by individually driving the light emitting cells Q11 and Q12.

Further, in order to satisfy regulations regarding a cut-off line, a general lamp apparatus includes a shade to cut off light applied to a vehicle approaching on the opposite side of the road so as to prevent blinding of a driver of the vehicle approaching on the opposite side of the road. However, the light emitting module 10-2 in accordance with this embodiment may satisfy regulations regarding a cut-off line by individually driving the light emitting cells and thus, does not require a shade and may simplify a lamp apparatus.

Figure 15:
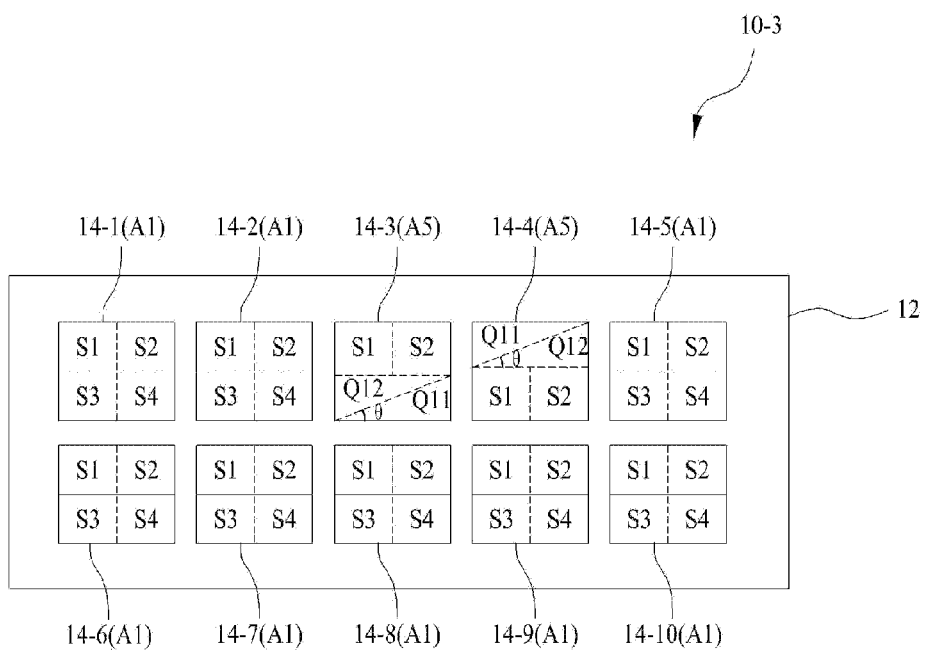
FIG. 15 is a view illustrating a light emitting module in accordance with another embodiment.

FIG. 15 is a view illustrating a light emitting module 10-3 in accordance with another embodiment.

With reference to FIG. 15, a plurality of light emitting devices 14-1 to 14-n (n being a natural number >1) may be arranged in a matrix including C columns (for example, C=2) and R rows (for example, R-5).

At least one of the plurality of light emitting devices, for example, 14-1 to 14-10, included in the light emitting module 10-3 may be the light emitting device A5, and the remaining light emitting devices may be the light emitting devices A1.

For example, at least one, for example, 14-3 and 14-4, of the light emitting devices 14-1 to 14-5 included in the $y^{th}$ column (y being a natural number satisfying for example, y=1) may be the light emitting device A5, and the remaining light emitting devices 14-1, 14-2, and 14-5 to 14-10 may be the light emitting devices A1.

For example, the light emitting devices A5 may be located at the $x^{th}$ row (for example, x=3) and the $(x+1)^{th}$ row (for example, x=3) of the $y^{th}$ column (for example, y=1), but is not limited thereto.

The light emitting device, for example, 14-4, provided as the light emitting device A5 and arranged at the $(x+1)^{th}$ row (for example, x=3) has the same structure as a structure acquired by rotating the light emitting device, for example, 14-3, arranged at the $x^{th}$ row (for example, x=3) by 180°.

Figure 16:
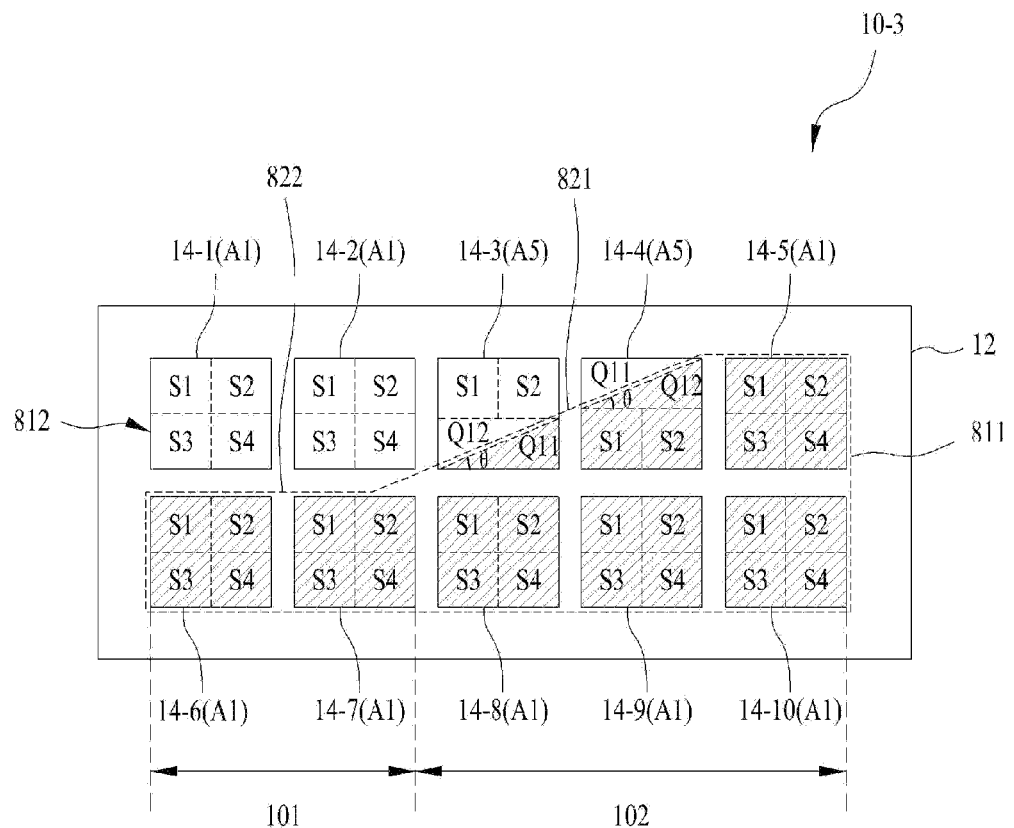
FIG. 16 is a view illustrating one example of light emission of the light emitting module in accordance with the embodiment.

FIG. 16 is a view illustrating one example of light emission of the light emitting module 10-3 in accordance with the embodiment.

With reference to FIG. 16, some of the light emitting cells, for example, S1, S2, Q11 and Q12, belonging to the light emitting devices 14-3 and 14-4 provided as the light emitting devices A5 may emit light, and the remaining light emitting cells may not emit light.

For example, both the first and second light emitting cells A1 and S2 may emit light or may not emit light, one of the third and fourth light emitting cells Q11 and Q12 may emit light, and the other may not emit light.

In more detail, the first and second light emitting cells A1 and S2 of the light emitting device, for example, 14-3, located at the $x^{th}$ row (for example, x=3) may not emit light, the third light emitting cell Q11 may emit light, and the fourth light emitting cell Q12 may not emit light.

Further, the first and second light emitting cells A1 and S2 of the light emitting device, for example, 14-4, located at the $(x+1)^{th}$ row (for example, x=3) may emit light, the third light emitting cell Q11 may not emit light, and the fourth light emitting cell Q12 may emit light.

Among the light emitting cells belonging to the light emitting module 10-3, an area corresponding to the light emitting cells which emit light may be referred to as an emissive area 811, and an area corresponding to the light emitting cells which do not emit light may be referred to as a non-emissive area 812.

The emissive area 811 may be discriminated from the non-emissive area 812 due to difference in light and darkness.

A first boundary line 821 may be formed between the non-emissive area 812 and the emissive area 811 corresponding to the light emitting devices, for example, 14-3 and 14-4, provided as the light emitting devices A5.

The first boundary line 821 may correspond to the edge of the emissive area 741 or a part of the sides of the emissive area 741 corresponding to the oblique sides of the light emitting cell Q11 included in the light emitting device, for example, 14-3, located at the $x^{th}$ row and the light emitting cell Q12 included in the light emitting device, for example, 14-4, located at the $(x+1)^{th}$ row, provided as the light emitting devices A5.

A second boundary line 822 may be formed between the non-emissive area 812 and the emissive area 811 corresponding to the light emitting devices, for example, 14-6 and 14-7, provided as the light emitting devices A1. The second boundary line 822 may correspond to the edge of the emissive area 811 or another part of the sides of the light emitting area 811 corresponding to one side of each of the light emitting cells A1 and S2 included in the light emitting devices, for example, 14-6 and 14-7, provided as the light emitting devices A1.

An angle of inclination $O_2$ of the first boundary line 822 to the second boundary line 822 may be equal to the angle θ between two neighboring sides, for example, 731 and 732, of the light emitting surface 620-1 of the light emitting cell Q11 included in the light emitting device, for example, 14-3, located at the $x^{th}$ row and the light emitting surface 620-2 of the light emitting cell Q12 included in the light emitting device, for example, 14-4, located at the $(x+1)^{th}$ row (θ2=0). For example, the angle of inclination θ2 of the first boundary line 821 to the second boundary line 822 may be 15°~45°.

The light emitting module 10-3 in accordance with this embodiment may individually drive the light emitting cells included in the light emitting devices 14-1 to 14-10 so that the angle of inclination θ2 of the first boundary line 821 may be 15°~45° so as to satisfy regulations regarding a cut-off line.

Figure 19:
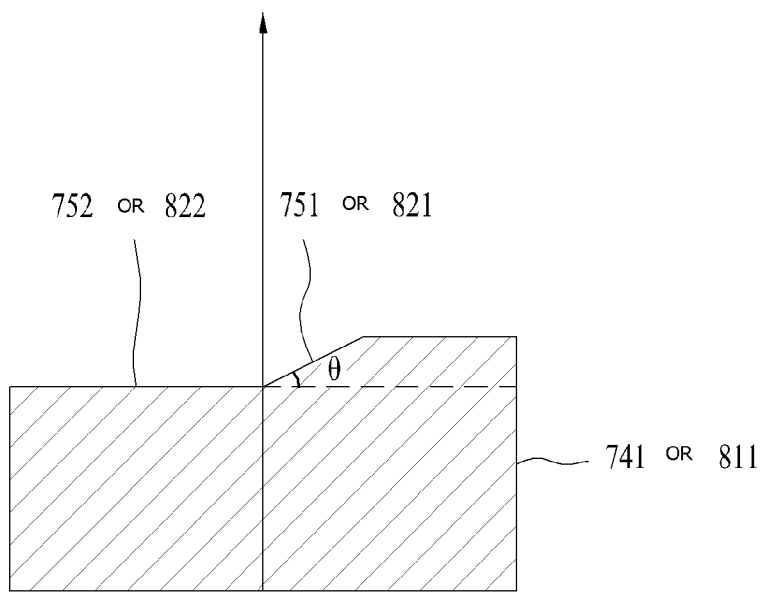
FIG. 19 is a view illustrating an emissive area shown in FIG. 14 or 16.

FIG. 19 is a view illustrating the emissive area 741 or 811 shown in FIG. 14 or 16.

With reference to FIG. 19, it may be understood that the first boundary line 751 or 821 of the emissive area 741 or 811 is inclined by a designated angle θ to the second boundary line 752 or 822.

FIGS. 17A to 17D are views illustrating examples of wire bonding of the light emitting cells in accordance with the embodiments.

Figure 17A:
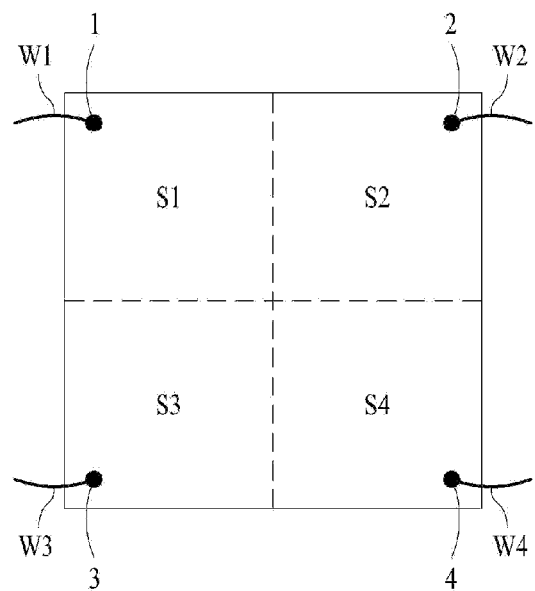
FIGS. 17A to 17D are views illustrating examples of wire bonding of light emitting cells in accordance with the embodiments.

With reference to FIG. 17A, the light emitting device, for example, A1, in accordance with one embodiment may include a plurality of light emitting cells S1, S2, S3, and S4 and a plurality of pads 1, 2, 3, and 4.

Each of the plurality of pads 1, 2, 3, and 4 may be disposed on a corresponding one of the plurality of light emitting cells S1, S2, S3, and S4.

For example, one of the plurality of pads 1, 2, 3, and 4 may be connected to a corresponding one of the plurality of light emitting cells S1, S2, S3, and S4.

A corresponding wire W1, W2, W3, or W4 may be bonded to each of the plurality of pads 1, 2, 3, and 4. Control power (for example, driving voltage or driving current) to individually drive each light emitting cell may be applied to each pad through the wire W1, W2, W3, or W4.

Figure 17B:
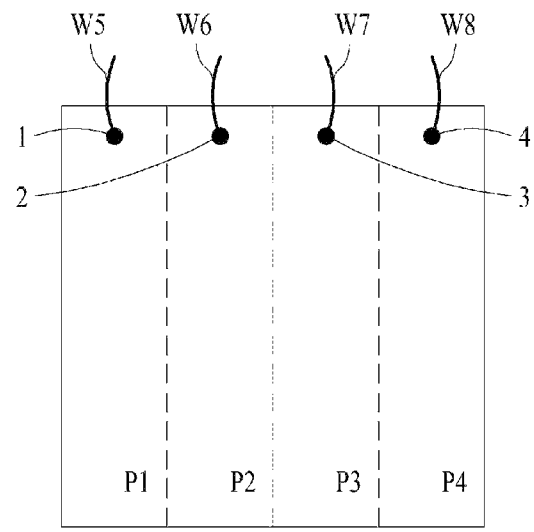

With reference to FIG. 17B, the light emitting device, for example, A2, in accordance with another embodiment may include a plurality of light emitting cells P1, P2, P3, and P4 and a plurality of pads 1, 2, 3, and 4.

Each of the plurality of pads 1, 2, 3, and 4 may be disposed on a corresponding one of the plurality of light emitting cells P1, P2, P3, and P4. For example, one of the plurality of pads 1, 2, 3, and 4 may be connected to a corresponding one of the plurality of light emitting cells P1, P2, P3, and P4. A corresponding wire W5, W6, W7, or W8 may be bonded to each of the plurality of pads 1, 2, 3, and 4.

Figure 17C:
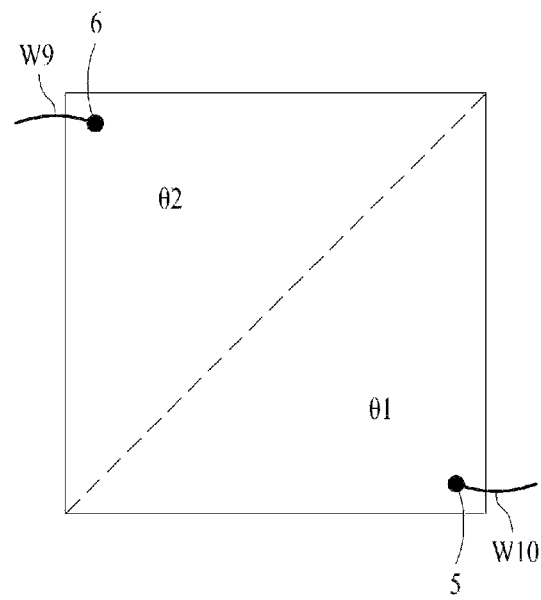

With reference to FIG. 17C, the light emitting device, for example, A3, in accordance with another embodiment may include a plurality of light emitting cells Q11 and Q12 and a plurality of pads 5 and 6.

Each of the plurality of pads 5 and 6 may be disposed on a corresponding one of the plurality of light emitting cells Q11 and Q12. For example, one of the plurality of pads 5 and 6 may be connected to a corresponding one of the plurality of light emitting cells Q11 and Q12. A corresponding wire W9 or W10 may be bonded to each of the plurality of pads 5 and 6.

Figure 17D:
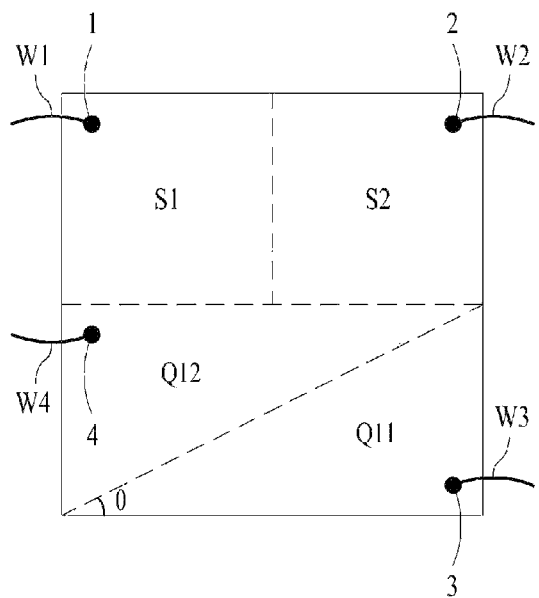

With reference to FIG. 17D, the light emitting device, for example, A5, in accordance with another embodiment may include a plurality of light emitting cells S1, S2, Q11, and Q12 and a plurality of pads 1, 2, 3, and 4.

Each of the plurality of pads 1, 2, 3, and 4 may be disposed on a corresponding one of the plurality of light emitting cells S1, S2, Q11, and Q12. For example, one of the plurality of pads 1, 2, 3, and 4 may be connected to a corresponding one of the plurality of light emitting cells S1, S2, Q11, and Q12. A corresponding wire W1, W2, W3, or W4 may be bonded to each of the plurality of pads 1, 2, 3, and 4.

In other embodiments, pads may be connected only to some light emitting cells desired to emit light. Wires to apply control power may be connected to the pads connected to the light emitting cells desired to emit light.

Figure 18A:
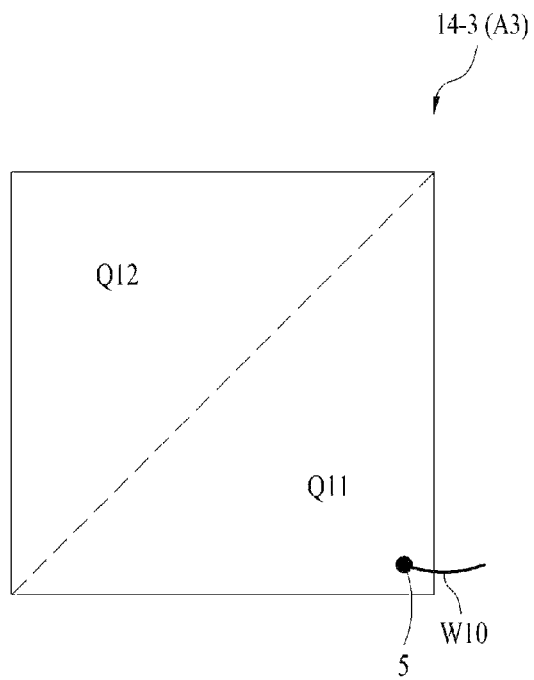
FIG. 18A is a view illustrating another example of wire bonding of the light emitting device in accordance with the embodiment shown in FIG. 14.

FIG. 18A is a view illustrating another example of wire bonding of the light emitting device 14-3 in accordance with the embodiment shown in FIG. 14.

With reference to FIG. 18A, in order to satisfy regulations regarding a cut-off line, only the first light emitting cell Q11 of the light emitting device 14-3 may emit light and the second light emitting cell Q12 may not emit light. Consequently, in order to drive the first light emitting cell Q11 alone, the light emitting device 14-3 may include a pad 5 on the first light emitting cell Q11 alone. Further, a wire W10 to apply control power to drive the first light emitting cell Q11 may be bonded to the pad 5.

Figure 18B:
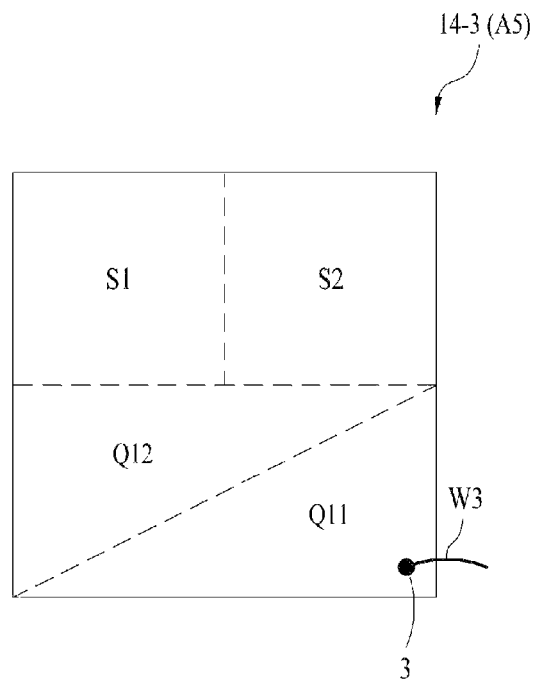
FIGS. 18B and 18C are views illustrating other examples of wire bonding of the light emitting device in accordance with the embodiment shown in FIG. 16.
Figure 18C:
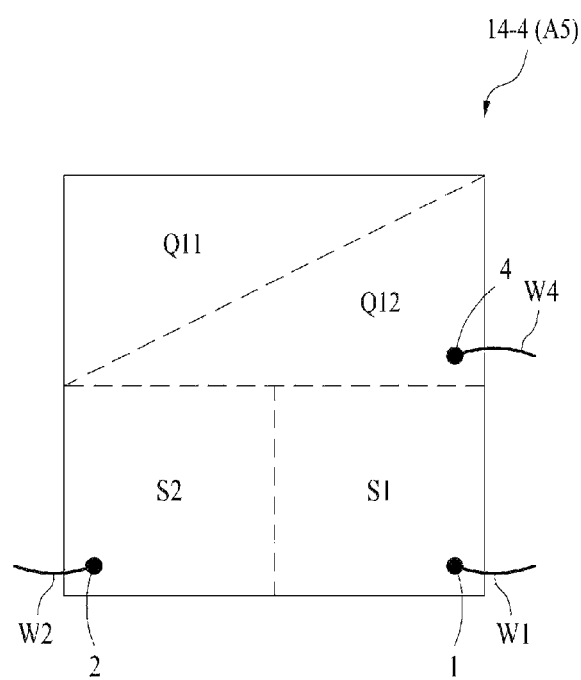

FIG. 18B is a view illustrating another example of wire bonding of the light emitting device 14-3 in accordance with the embodiment shown in FIG. 16, and FIG. 18C is a view illustrating another example of wire bonding of the light emitting device 14-4 in accordance with the embodiment shown in FIG. 16.

With reference to FIGS. 18B and 18C, in order to satisfy regulations regarding a cut-off line, the light emitting cell Q11 of the light emitting device 14-3 (A5) and the light emitting cells S1, S2, and Q12 of the light emitting device 14-4 (A5) may emit light and the light emitting cell Q12 of the light emitting device 14-3 (A5) and the light emitting cell Q11 of the light emitting device 14-4 (A5) may not emit light.

Consequently, in order to drive the light emitting cell Q11 alone, the light emitting device 14-3 (A5) may include a pad 3 on the light emitting cell Q11 alone. Further, a wire W3 to apply control power may be bonded to the pad 3.

Further, in order to drive the light emitting cells S1, S2, and Q12 alone, the light emitting device 14-4 (A5) may include pads 1, 2, and 4 on the light emitting cells S1, S2, and Q12 alone, and wire W1, W2, and W4 to apply control power may be bonded to the pads 1, 2, and 4.

In the examples shown in FIGS. 18A to 18C, in order to satisfy regulations regarding a cut-off line, pads and wires may be connected only to light emitting cells desired to emit light and thus, unnecessary wire bonding may be removed and design freedom in arrangement of light emitting devices may be improved.

Figure 20A:
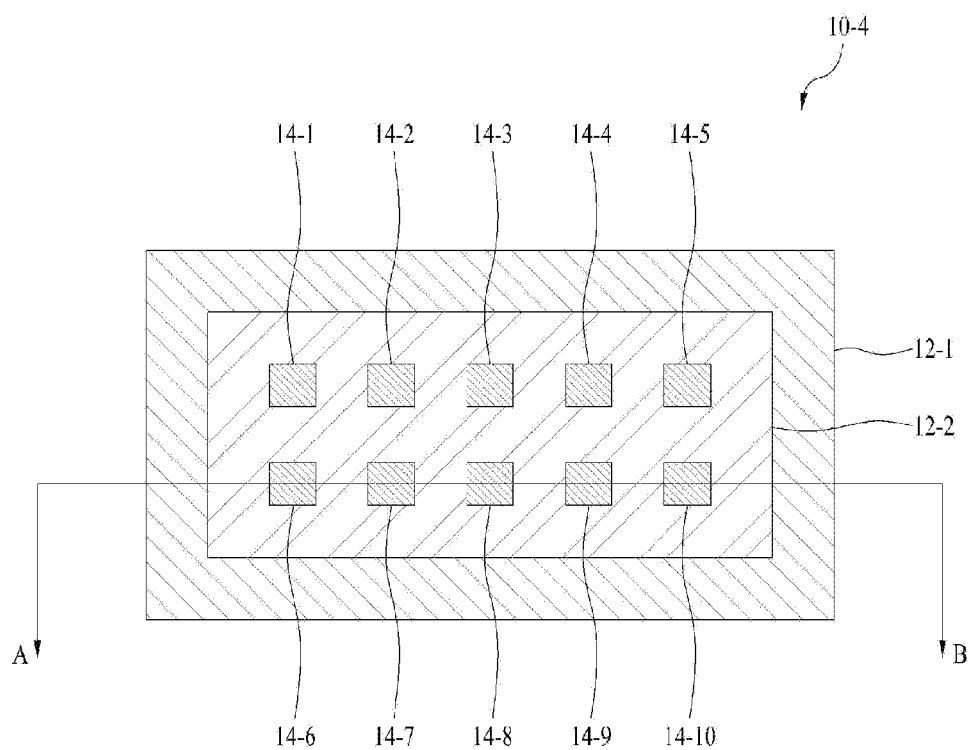
FIG. 20A is a view illustrating a light emitting module in accordance with another embodiment.
Figure 20B:
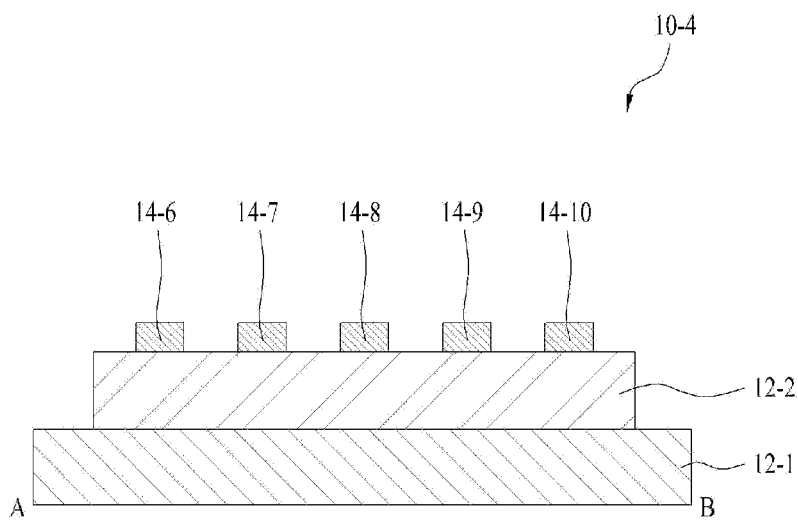
FIG. 20B is a cross-sectional view of the light emitting module shown in FIG. 20A, taken along line A-B.

FIG. 20A is a view illustrating a light emitting module 10-4 in accordance with another embodiment and FIG. 20B is a cross-sectional view of the light emitting module 10-4 shown in FIG. 20A, taken along line A-B.

With reference to FIGS. 20A and 20B, the light emitting module 10-4 may include a first substrate 12-1, a second substrate 12-2 disposed on the first substrate 12-2, and a plurality of light emitting devices 14-1 to 14-n (n being a natural number >1) disposed on the second substrate 12-2. The plurality of light emitting devices 14-1 to 14-n (n being a natural number >1) may be bonded to the second substrate 12-2 through eutectic bonding or die bonding.

Although the area of the second substrate 12-2 may less than the area of the first substrate 12-1, the area of the second substrate 12-2 may be equal to the area of the first substrate 12-1 in another embodiment.

A circuit pattern may be formed on the second substrate 12-2 and the plurality of light emitting devices 14-1 to 14-n (n being a natural number >1) may be electrically connected to the circuit pattern of the second substrate 12-2 through wires (not shown).

The first substrate 12-1 may be a metal substrate having first thermal conductivity and the second substrate 12-2 may be an insulating substrate having second thermal conductivity. For example, the first thermal conductivity of the first substrate 12-1 may be higher than the second thermal conductivity of the second substrate 12-2. The reason for this is to rapidly discharge heat generated from the plurality of light emitting devices 14-1 to 14-n (n being a natural number >1) disposed on the second substrate 12-2 to the outside.

For example, the first substrate 12-1 may be a metal core printed circuit board (MCPCB). Further, the first substrate 12-1 may be a radiant plate having high thermal conductivity and be formed of one selected from the group consisting of copper (Cu), aluminum (Al), silver (Ag), and gold (Au), or an alloy including at least one selected from the group. The second substrate 12-2 may be formed of a nitride having high thermal conductivity, for example, AlN.

In accordance with another embodiment, the second substrate 12-2 may include an anodized layer. Further, in accordance with another embodiment, the first substrate 12-1 and the second substrate 12-2 may be formed of the same material, for example, at least one selected from the group consisting of AlN, Al, Cu, and Au.

Although the upper surface of the second substrate 12-2 on which the light emitting devices 14-1 to 14-n (n being a natural number >1) are disposed may be flat, the upper surface of the second substrate 12-2 may be concave or convex in another embodiment. Further, in another embodiment, the upper surface of the second substrate 12-2 may have a structure in which at least two of a concave surface, a convex surface, and a flat surface are combined.

The light emitting devices 14-1 to 14-n (n being a natural number >1) may be LED chips. The LED chips may include white LED chips, red LED chips, blue LED ships, or infrared LED chips, or may be provided as a package in which at least one of red LED chips, green LED chips, blue LED ships, yellow-green LED chips, and white LED chips is combined.

For example, if this embodiment is applied to a headlamp for vehicles, the light emitting devices 14-1 to 14-n (n being a natural number >1) may be vertical white LED chips, but are not limited thereto.

The light emitting devices 14-1 to 14-n (n being a natural number >1) included in the light emitting module 10-4 may have the same arrangement and structure as those of the light emitting devices included in one of the light emitting modules 10-1 to 10-3 in accordance with the former embodiments.

Figure 21A:
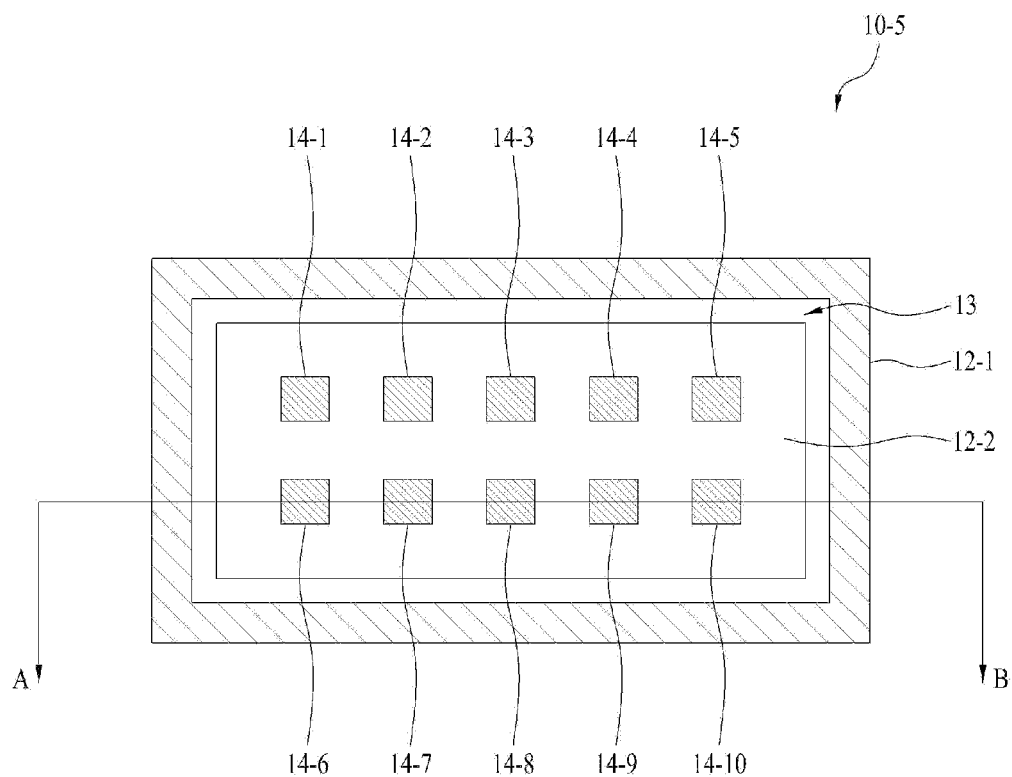
FIG. 21A is a view illustrating a light emitting module in accordance with another embodiment.
Figure 21B:
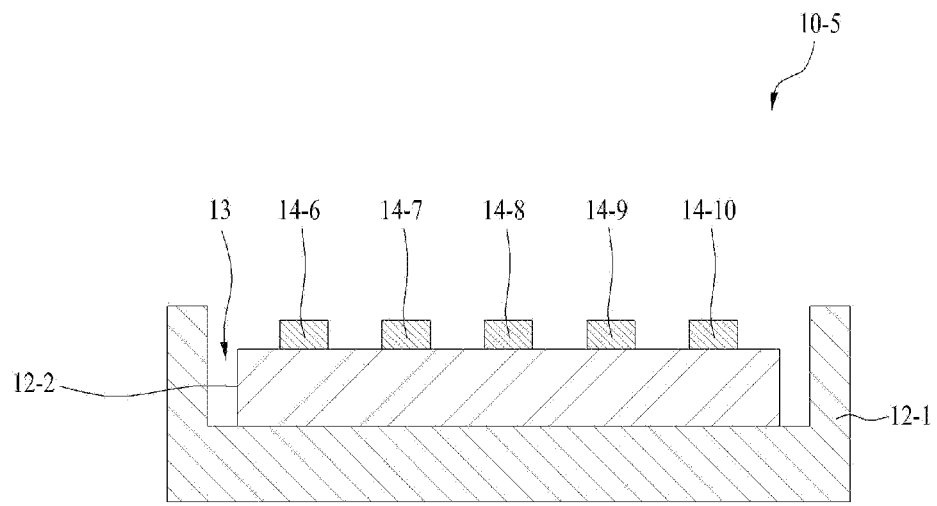
FIG. 21B is a cross-sectional view of the light emitting module shown in FIG. 21A, taken along line A-B.

FIG. 21A is a view illustrating a light emitting module 10-5 in accordance with another embodiment and FIG. 21B is a cross-sectional view of the light emitting module 10-5 shown in FIG. 21A, taken along line A-B. Some parts in this embodiment which are substantially the same as those in the former embodiment shown in FIGS. 20A and 20B are denoted by the same reference numerals even though they are depicted in different drawings and a detailed description thereof will thus be simplified or omitted because it is considered to be unnecessary.

With reference to FIGS. 21A and 21B, as compared to the light emitting module 10-4 in accordance with the former embodiment shown in FIGS. 20A and 20B, a first substrate 12-1 of the light emitting module 10-5 may include a cavity 13 and a second substrate 12-2 may be disposed within the cavity 13 of the first substrate 12-1.

Figure 22A:
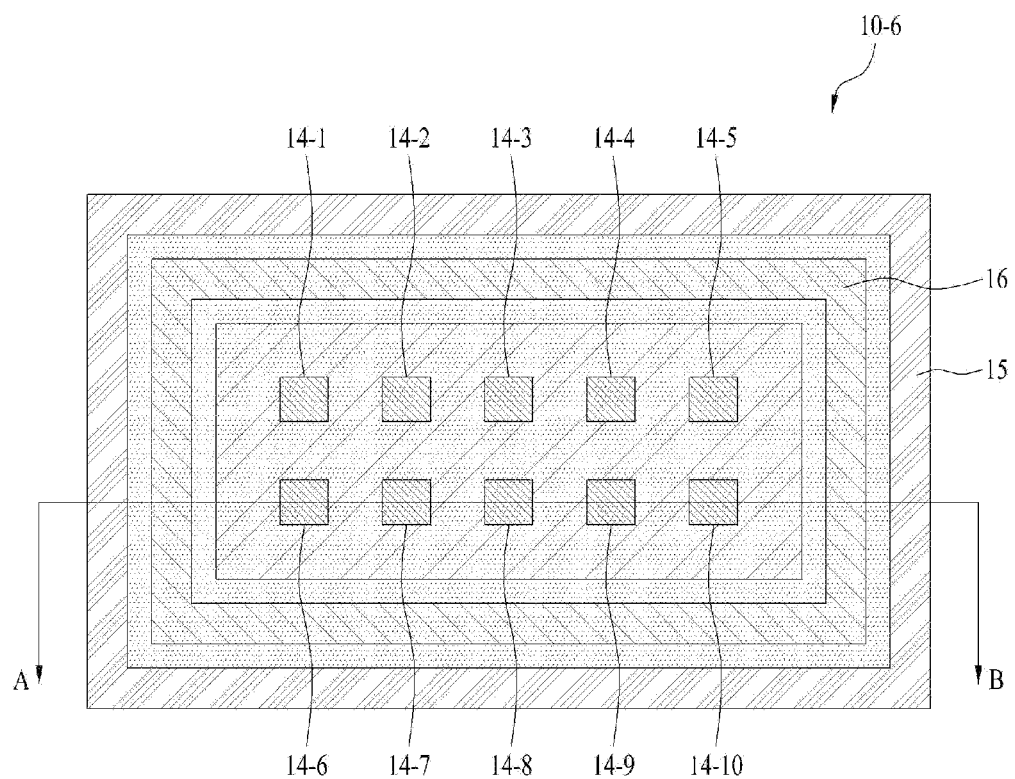
FIG. 22A is a view illustrating a light emitting module in accordance with another embodiment.
Figure 22B:
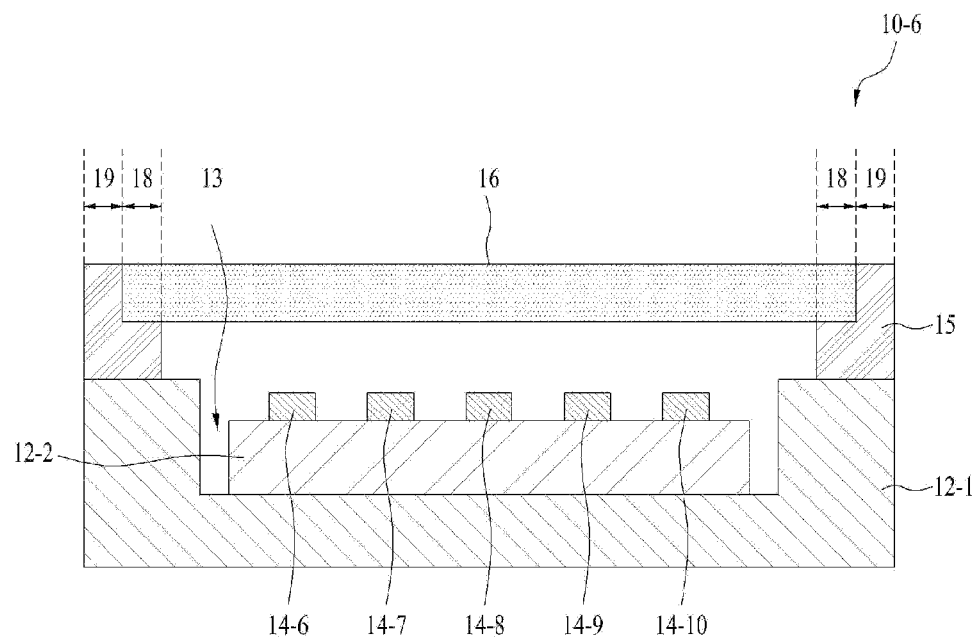
FIG. 22B is a cross-sectional view of the light emitting module shown in FIG. 22A, taken along line A-B.

FIG. 22A is a view illustrating a light emitting module 10-4 in accordance with another embodiment and FIG. 22B is a cross-sectional view of the light emitting module 10-4 shown in FIG. 22A, taken along line A-B. Some parts in this embodiment which are substantially the same as those in the former embodiment shown in FIGS. 20A and 20B are denoted by the same reference numerals even though they are depicted in different drawings and a detailed description thereof will thus be simplified or omitted because it is considered to be unnecessary.

With reference to FIGS. 22A and 22B, the light emitting module 10-4 includes a first substrate 12-1, a second substrate 12-2, a plurality of light emitting devices 14-1 to 14-n (n being a natural number >1), a barrier 15, and a cover glass 16.

The second substrate 12-2 may be disposed on the first substrate 12-1, and the plurality of light emitting devices 14-1 to 14-n (n being a natural number >1) may be disposed on the second substrate 12-2. The first substrate 12-1 may include a cavity 13 and the second substrate 12-2 may be disposed within the cavity 13 of the first substrate 12-1.

The barrier 15 may be disposed on the edge of the first substrate 12-1 around the cavity 13. The barrier 15 may protect wires (not shown) electrically connected to the plurality of light emitting devices 14-1 to 14-n (n being a natural number >1) and support the cover glass 16.

The barrier 15 may have a polygonal or ring shape, but is not limited thereto.

The barrier 15 may reflect light emitted from the light emitting devices 14-1 to 14-n (n being a natural number >1) and thus, improve light extraction efficiency. The barrier may be formed of a reflective member, for example, a material including at least one of aluminum (Al), silver (Ag), platinum (Pt), rhodium (Rh), radium (Ra), palladium (Pd), chrome (Cr).

The cover glass 16 may be disposed on the barrier 15 so as to be separated from the plurality of light emitting devices 14-1 to 14-n (n being a natural number >1) by a designated distance. For example, an interval between the upper surfaces of the light emitting devices 14-1 to 14-n (n being a natural number >1) and the lower surface of the cover glass 16 may be about 0.1 mm~50 mm.

The cover glass 16 may protect the light emitting devices 14-1 to 14-n (n being a natural number >1) and transmit light emitted from the light emitting devices 14-1 to 14-n (n being a natural number >1).

In order to improve light transmittance, the cover glass 16 may include an anti-reflective coating film. The cover glass 16 including an anti-reflective coating film may be between attaching the anti-reflective coating film to a base formed of glass, or coating the base with an anti-reflective coating liquid through spin coating or spray coating.

For example, the anti-reflective coating film may include at least one of $TiO_2$, $SiO_2$, $Al_2O_3$, $Ta_2O_5$, $ZrO_2$, and $MgF_2$.

The cover glass 16 may include a hole (not shown) or an opening (not shown) to discharge gas generated due to heat generated from the light emitting devices 14-1 to 14-n (n being a natural number >1).

The cover glass 16 may include a filter (not shown) to transmit light of a specific wavelength alone or include a shielding or reflective pattern (not shown) to adjust the orientation angle of light. In another embodiment, the cover glass 16 may be formed in a dome shape having a hole or an opening.

The cover glass 16 may be supported by a part of the upper surface of the barrier 15. For example, the upper surface of the barrier 15 may be divided into a first region 18 and a second region 19 having a height difference. The cover glass 16 may be supported by the first region 18.

The light emitting devices 14-1 to 14-n (n being a natural number >1) included in the light emitting module 10-6 may have the same arrangement and structure as those of the light emitting devices included in one of the light emitting modules 10-1 to 10-3 in accordance with the former embodiments.

Figure 23:
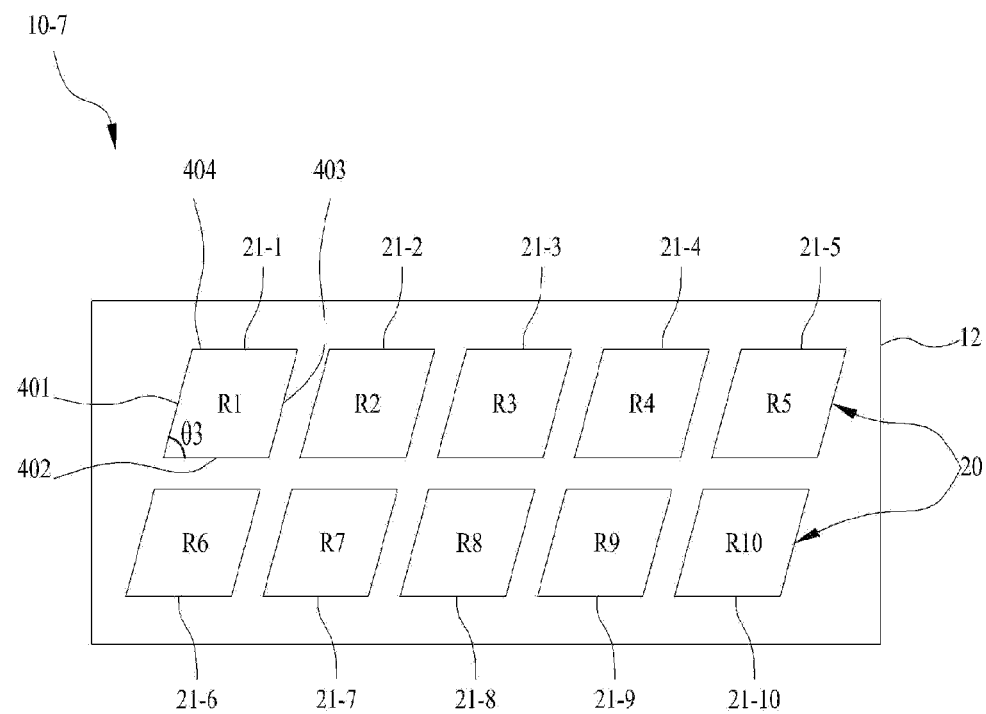
FIG. 23 is a view illustrating a light emitting module in accordance with another embodiment.

FIG. 23 is a view illustrating a light emitting module 10-7 in accordance with another embodiment.

With reference to FIG. 23, the light emitting module 10-7 includes a substrate 12 and a plurality of light emitting devices 21-1 to 21-n (n being a natural number >1) individually driven.

The plurality of light emitting devices 21-1 to 21-n (n being a natural number >1) may be arranged in a row, or be arranged in a matrix including C columns and R rows.

Each of the plurality of light emitting devices 21-1 to 21-n (n being a natural number >1) may include a light emitting surface Rk (1≤k≤n) emitting light. For example, the light emitting surface Rk (1≤k≤n) may be the upper surface of each of the plurality of light emitting devices 21-1 to 21-n (n being a natural number >1) mounted on the substrate 12 or the upper surface of a light emitting structure 410 which will be described later.

The light emitting surface Rk (1≤k≤n) may include four sides 401, 402, 403, and 404, and an angle θ3 between two neighboring sides 401 and 402 may be equal to or greater than 15° and less than 90° (15°≤θ3<90°). For example, the shape of the light emitting surface Rk (1≤k≤n) may be a parallelogram, and the angle θ3 between two neighboring sides 401 and 402 may be equal to or greater than 15° and less than 90° (15°≤θ3<90°).

Figure 24:
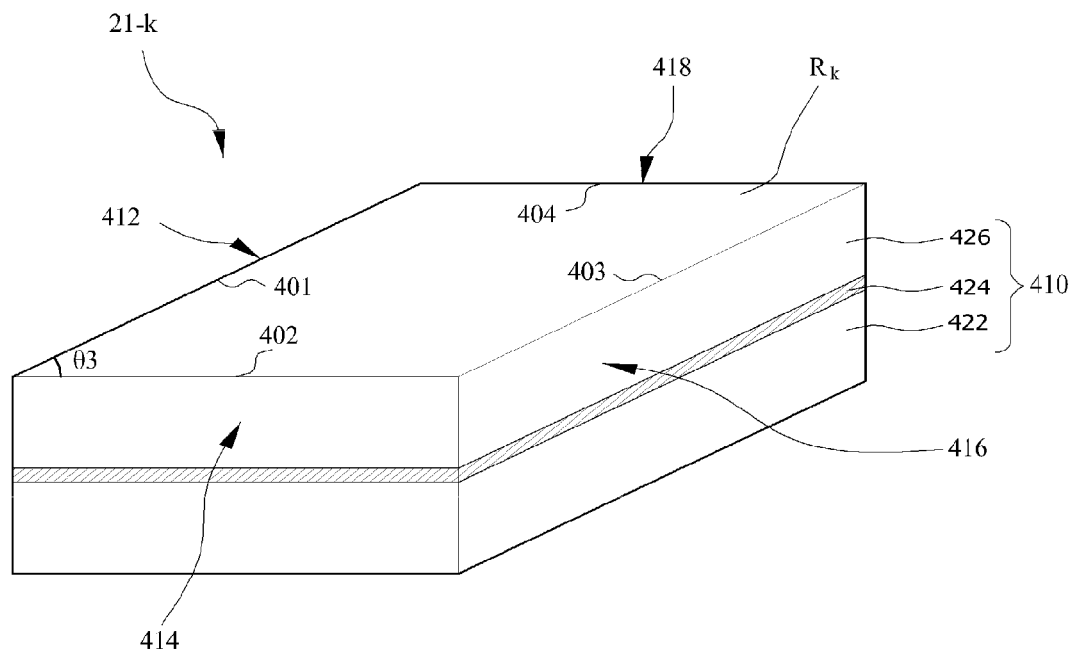
FIG. 24 is a cross-sectional view of a light emitting device shown in FIG. 23.

FIG. 24 is a cross-sectional view of the light emitting device 21-k (1≤k≤n) shown in FIG. 23.

With reference to FIG. 24, the light emitting device 21-k (1≤k≤n) may include a light emitting structure 410 including a first semiconductor layer 422, an active layer 424, and a second semiconductor layer 426.

The compositions of the first semiconductor layer 422, the active layer 424, and the second semiconductor layer 426 may be the same as the compositions of the first semiconductor layer 52, the active layer 54, and the second semiconductor layer 56 described above with reference to FIG. 5.

For example, the light emitting structure 410 may have the light emitting surface Rk) including four sides 401, 402, 403, and 404 and the angle θ3 between two neighboring sides 401 and 402 may be equal to or greater than 15° and less than 90°.

Further, for example, the light emitting structure 410 may have including four side surfaces 412, 414, 416, and 418 and an angle θ3 between two neighboring side surfaces 412 and 414 may be equal to or greater than 15° and less than 90°.

Figure 25:
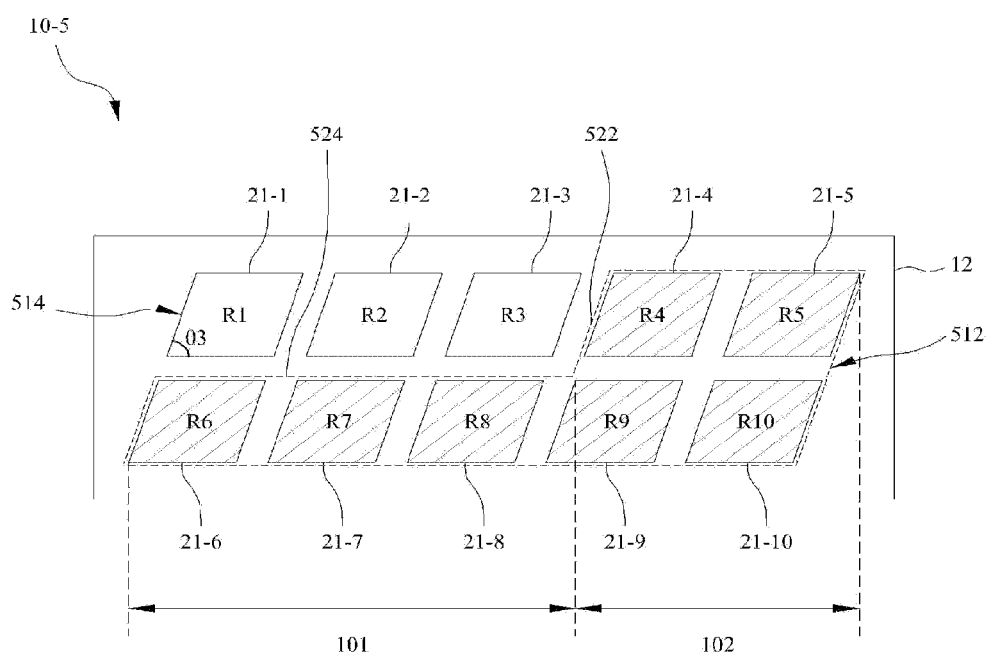
FIG. 25 is a view illustrating one example of light emission of the light emitting module of the embodiment shown in FIG. 23.

FIG. 25 is a view illustrating one example of light emission of the light emitting module 10-7 of the embodiment shown in FIG. 23.

With reference to FIG. 25, some 21-4 to 21-10 of the light emitting devices 21-1 to 21-n (n being a natural number >1) may emit light, and the remaining light emitting devices 21-1 to 21-3 may not emit light.

The light emitting devices 21-1 to 21-3 located at the first row to the $x^{th}$ row (for example, x=3) of the $y^{th}$ column (for example, y=1) may not emit light, the light emitting devices 21-4 and 21-5 located at the $(x+1)^{th}$ row (for example, x=3) to the last row of the $y^{th}$ column (for example, y=1) may emit light, and the light emitting devices 21-6 to 21-10 located at all rows of the $(y+1)^{th}$ column (for example, y=1) may emit light.

Among the light emitting devices 21-1 to 21-10 belonging to the light emitting module 10-7, an area corresponding to the light emitting devices 21-4 to 21-10 which emit light may be referred to as an emissive area 512, and an area corresponding to the light emitting devices 21-1 to 21-3 which do not emit light may be referred to as a non-emissive area 514.

A first boundary line 522 may be formed between the non-emissive area 514 and the emissive area 512 corresponding to the first side 401 of the light emitting device 21-4, and a second boundary line 524 may be formed between the non-emissive area 514 and the emissive area 512 corresponding to the fourth sides 404 of the light emitting devices 21-6, 21-7, and 21-8. An angle of inclination of the first boundary line 522 to the second boundary line 524 may be 15°~45°. The reason for this is that each of the light emitting devices 21-1 to 21-n (n being a natural number >1) has the parallelogram-shaped light emitting surface Rk (1≤k≤n), two neighboring sides 401 and 402 of which is equal to or greater than 15° and less than 90°.

The light emitting module 10-7 in accordance with this embodiment individually drives the light emitting devices, each of which has the parallelogram-shaped light emitting surface Rk (1≤k≤n), two neighboring sides 401 and 402 of which is equal to or greater than 15° and less than 90°, and may thus satisfy regulations regarding a cut-off line.

Figure 26:
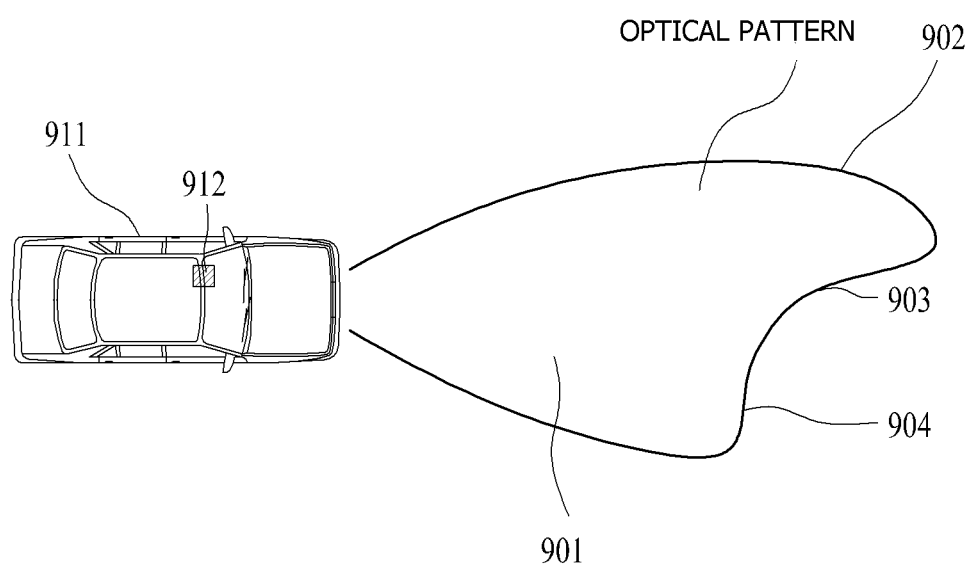
FIG. 26 is a view illustrating an optical pattern of a lamp apparatus for vehicles including one of the light emitting modules in accordance with the embodiments.

FIG. 26 is a view illustrating an optical pattern of a lamp apparatus 100 for vehicles including one of the light emitting modules 10-2 to 10-7 in accordance with the embodiments. With reference to FIG. 26, light emitted from one of light emitting modules 10-2 to 10-7 may pass through the lens 30 and be emitted in the forward direction of a vehicle 911.

As exemplarily shown in FIGS. 14, 16, and 25, the emissive areas 741, 811, and 512 may be divided into two areas, i.e., a first emissive area 101 and a second emissive area 102, having a height difference by the first boundary lines 751, 821, and 522 and the second boundary lines 752, 822, and 524.

The first emissive area 101 may be an area emitting light only under the second boundary line 752, 822, or 524, and the second emissive area 102 may be an area emitting light above the second boundary line 752, 822, or 524 as well as under the second boundary line 752, 822, or 524.

The lamp apparatus 100 for vehicles may have an optical pattern including light distribution areas 901 and 902 corresponding to the two light emissive areas 101 and 102 having a height difference.

In the first light distribution area 901, light is applied only under a second boundary line 904 of the optical pattern and thus, obstruction to a field of vision of a driver of a vehicle approaching on the opposite side of the road may be prevented. In the second light distribution area 902, light is applied above the second boundary line 904 as well as under the second boundary line 904 and thus, a field of vision of a driver 912 may be secured. A first boundary line 903 of the optical pattern may correspond to first boundary lines 751, 821, and 522 shown in FIGS. 14, 16, and 25, and the second boundary line 904 of the optical pattern may correspond to the second boundary lines 752, 822, and 524. Therefore, the lamp apparatus 100 for vehicles may satisfy regulations regarding a cut-off line.

As is apparent from the above description, a light emitting module and a lamp apparatus in accordance with one embodiment may reduce dark regions.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting module comprising:
a substrate; and
a plurality of light emitting devices disposed on the substrate,
wherein at least one of the plurality of light emitting devices includes:
a first light emitting cell having a tetragonal first light emitting surface;
a second light emitting cell having a tetragonal second light emitting surface;
a third light emitting cell having a right-angle triangular third light emitting surface; and
a fourth light emitting cell having a right-angle triangular fourth light emitting surface, the light emitting cells being individually driven,
wherein the first to fourth light emitting cells each include a light emitting structure including a first semiconductor layer, an active layer, and a second semiconductor layer, and has a light emitting surface,
wherein a first side of the tetragonal first light emitting surface and a first side of the tetragonal second light emitting surface neighbor each other and are opposite to each other,
wherein a first oblique side of the right-angle triangular third light emitting surface and a first oblique side of the right-angle triangular fourth light emitting surface are opposite to each other, and
wherein a second side of the right-angle triangular fourth light emitting surface is adjacent to and opposite to a second side of the tetragonal first light emitting surface and a second side of the tetragonal second light emitting surface.

2. The light emitting module according to claim 1, wherein the first oblique side and a second side of the right-angle triangular third light emitting surface is 15°~45°.

3. The light emitting module according to claim 1, wherein each of the plurality of light emitting devices further includes an insulating layer disposed between neighboring light emitting cells.

4. The light emitting module according to claim 1, further comprising at least one pad connected to at least one of the first to fourth light emitting cells.

5. The light emitting module according to claim 4, further comprising at least one wire bonded to the at least one pad.

6. The light emitting module according to claim 5, wherein power to drive at least one of the first to fourth light emitting cells is independently applied to the at least one pad through the at least one wire.

7. The light emitting module according to claim 1, wherein the tetragonal first light emitting surface, the tetragonal second light emitting surface, the right-angle triangular third light emitting surface and the right-angle triangular fourth light emitting surface are an upper surface of the light emitting structure.

8. The light emitting module according to claim 1, further comprising a first pad disposed on the right-angle triangular third light emitting surface of the first light emitting device except the tetragonal first light emitting surface, the tetragonal second light emitting surface, and the right-angle triangular fourth light emitting surface.

9. The light emitting module according to claim 1, wherein each of the tetragonal first light emitting surface and the tetragonal second light emitting surface is square.

10. The light emitting module according to claim 1, wherein a separation distance between neighboring light emitting cells of the first to fourth light emitting cells is less than a separation distance between neighboring light emitting devices of the plurality of light emitting devices.

11. The light emitting module according to claim 1, wherein each of the remaining light emitting devices except the at least one of the plurality of light emitting devices is implemented as a single chip and includes a plurality of light emitting cells which are individually driven.

12. A light emitting module comprising:
a substrate; and
a plurality of light emitting devices disposed on the substrate in a matrix including C columns (C being a natural number >1) and R rows (R being a natural number >1),
wherein the plurality of light emitting devices includes light emitting cells which are individually driven,
wherein the light emitting cells includes a light emitting structure including a first semiconductor layer, an active layer, and a second semiconductor layer, and has a light emitting surface, and
wherein at least one of the plurality of light emitting devices in a $Y^{th}$ column (Y being a natural number $1 \leq y \leq C$) includes:
a first light emitting cell having a tetragonal first light emitting surface;
a second light emitting cell having a tetragonal second light emitting surface;
a third light emitting cell having a right-angle triangular third light emitting surface; and a fourth light emitting cell having a right-angle triangular fourth light emitting surface which are individually driven,
wherein a first side of the tetragonal first light emitting surface and a first side of the tetragonal second light emitting surface neighbor each other and are opposite to each other,
wherein a first oblique side of the right-angle triangular third light emitting surface and a first oblique side of the right-angle triangular fourth light emitting surface are opposite to each other, and
wherein a second side of the right-angle triangular fourth light emitting surface is adjacent to and opposite to a second side of the tetragonal first light emitting surface and a second side of the tetragonal second light emitting surface.

13. The light emitting module according to claim 12, wherein the first oblique side and a second side of the right-angle triangular third light emitting surface is 15°~45°.

14. The light emitting module according to claim 12, wherein each of a first light emitting device located at an $X^{th}$ row and a second light emitting device located at the $(X+1)^{th}$ row of the $Y^{th}$ column includes the first to the fourth light emitting cells, and
wherein the second light emitting device has the same structure as a structure acquired by rotating the first light emitting device by 180°.

15. The light emitting module according to claim 12, further comprising a pad only disposed on the right-angle triangular third light emitting surface except the tetragonal first light emitting surface, the tetragonal second light emitting surface, and the right-angle triangular fourth light emitting surface.

16. The light emitting module according to claim 12, further comprising a pad disposed on each of the tetragonal first light emitting surface, the tetragonal second light emitting surface, and the right-angle triangular fourth light emitting surface of the second light emitting device except the right-angle triangular third light emitting surface.

17. The light emitting module according to claim 12, wherein each of the tetragonal first light emitting surface and the tetragonal second light emitting surface is square.

18. The light emitting module according to claim 12, wherein each of the remaining light emitting devices of the plurality of light emitting devices includes a plurality of light emitting cells which are individually driven.

19. The light emitting module according to claim 12, wherein a separation distance between neighboring light emitting cells of the first to fourth light emitting cells is less than a separation distance between neighboring light emitting devices of the plurality of light emitting devices.

20. A light emitting module comprising:
a substrate; and
a plurality of light emitting devices disposed on the substrate in a matrix including C columns (C being a natural number >1) and R rows (R being a natural number >1),
wherein each of two light emitting devices located at adjacent rows in a column of the matrix includes:
a first light emitting cell having a tetragonal first light emitting surface;
a second light emitting cell having a tetragonal second light emitting surface;
a third light emitting cell having a right-angle triangular third light emitting surface; and
a fourth light emitting cell having a right-angle triangular fourth light emitting surface which are individually driven,
wherein a first side of the tetragonal first light emitting surface and a first side of the tetragonal second light emitting surface neighbor each other and are opposite to each other,
wherein a first oblique side of the right-angle triangular third light emitting surface and a first oblique side of the right-angle triangular fourth light emitting surface are opposite to each other,
wherein a second side of the right-angle triangular fourth light emitting surface is adjacent to and opposite to a second side of the tetragonal first light emitting surface and a second side of the tetragonal second light emitting surface, and
wherein the two light emitting devices are symmetrical to each other by rotating one of the two light emitting devices by 180°.

* * * * *